US007346480B1

(12) United States Patent
Pekarek et al.

(10) Patent No.: US 7,346,480 B1
(45) Date of Patent: Mar. 18, 2008

(54) IMPEDANCE MISMATCH MODELING IN A DATA FLOW OR DISCRETE TIME BASED SYSTEM SIMULATION

(75) Inventors: Joseph Edward Pekarek, Manhattan Beach, CA (US); Albert Santos, Cambridge, MA (US); Scotty Hudson, Lafayette, CO (US)

(73) Assignee: Applied Wave Research, Inc., El Segundo, CA (US)

( * ) Notice: Subject to any disclaimer, the term of this patent is extended or adjusted under 35 U.S.C. 154(b) by 424 days.

(21) Appl. No.: 10/611,314

(22) Filed: Jun. 30, 2003

Related U.S. Application Data

(60) Provisional application No. 60/392,647, filed on Jun. 29, 2002.

(51) Int. Cl.
*G06F 17/50* (2006.01)
*H03K 17/16* (2006.01)
*H04B 15/10* (2006.01)
*H04B 1/10* (2006.01)
*H01Q 11/12* (2006.01)

(52) U.S. Cl. ............................. 703/14; 326/30; 455/62; 455/118; 455/304

(58) Field of Classification Search ................... 703/14; 326/30; 455/62, 118, 304
See application file for complete search history.

(56) References Cited

U.S. PATENT DOCUMENTS 6,642,741 B2* 11/2003 Metz et al. ................... 326/30

6,985,698 B2* 1/2006 Aggarwal et al. ............ 455/62
2001/0045843 A1* 11/2001 Hernandez-Marti .......... 326/30

OTHER PUBLICATIONS

Kim et al. 'Full Software Analysis and Impedance Matching of Radio Frequency CMOS Integrated Circuits'. vol. 23, Mar. 2000. pp. 183-189.*
Lathi, B.P. 'Linear Systems and Signals'. Berkely-Cambridge Press, 1992. pp. 278-284.*
Eo et al. "Generalized Coupled Interconnect Transfer Function and High-Speed Signal Simulations" IEEE Transactions of Microwave Theory and Techniques, vol. 43 No. 5 May 1995.*
Bockelman et al. "Combined Differential and Common-Mode Scattering Parameters: Theory and Simulation" IEEE Transactions on Microwave Theory and Techniques, vol. 43, No. 7 Jul. 1995.*

* cited by examiner

*Primary Examiner*—Kamini Shah
*Assistant Examiner*—Shambhavi Patel

(57) ABSTRACT

This invention provides directional connectivity described by the interconnections of the blocks in the schematic or netlist that are used to propagate impedance data from one block to another. The propagation of impedance data for discrete time based simulation programs allow for the simulation under less than ideal termination conditions between the blocks. This invention also supports functionality where the input impedance and output impedance of each block are not perfectly terminated. This assumption can lead to very significant modeling errors in the simulated results. In general, termination impedances are complex frequency dependent functions that result in frequency dependent mismatch losses between the blocks. This invention allows for the propagation and calculation of impedance mismatches between the various blocks.

14 Claims, 36 Drawing Sheets

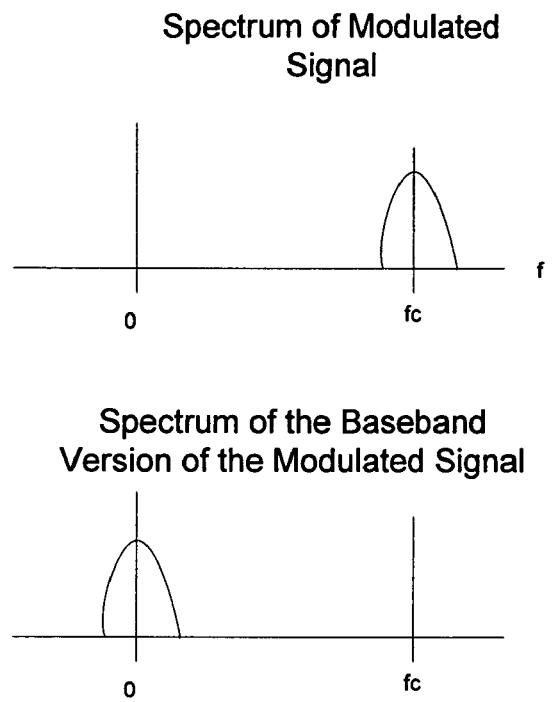
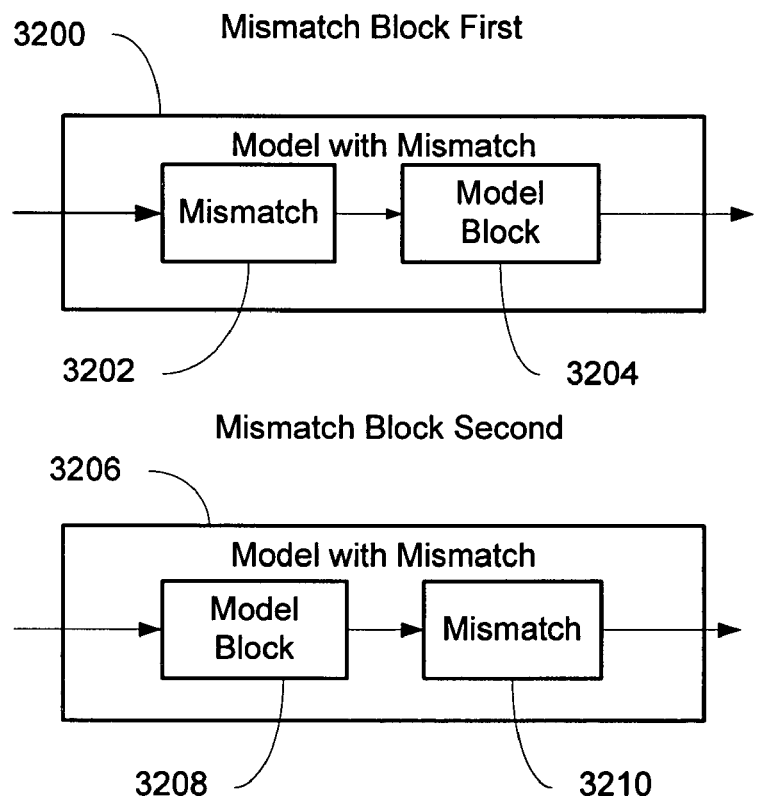
Figure 31
Figure 32

Mismatch Block Separate
Prior to Input
After Output
Figure 33
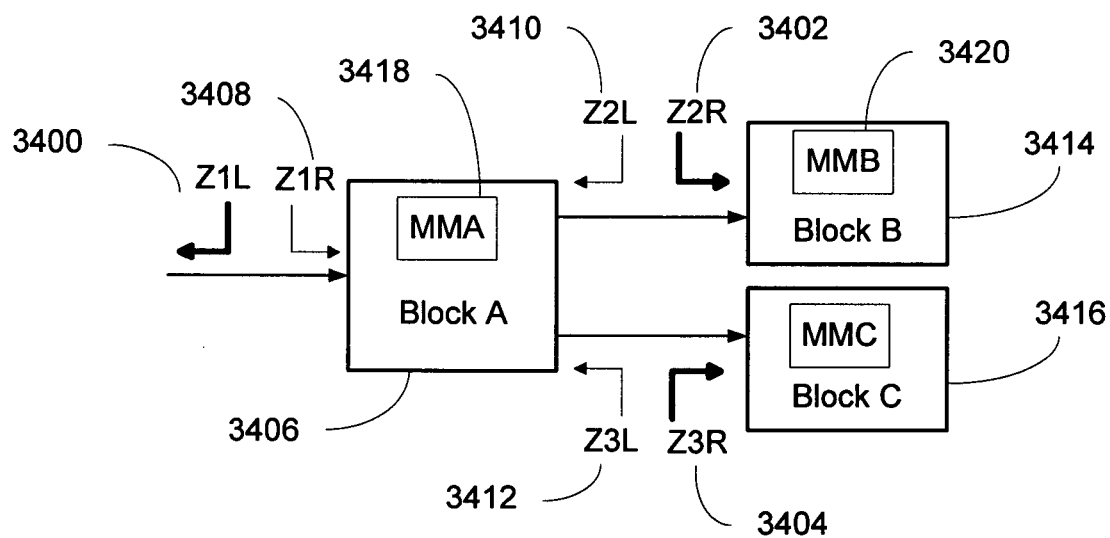
Figure 34

IMPEDANCE MISMATCH MODELING IN A DATA FLOW OR DISCRETE TIME BASED SYSTEM SIMULATION

CROSS REFERENCE TO RELATED APPLICATIONS

This patent application claims priority to U.S. Provisional Patent Application No. 60/392,647 filed on Jun. 29, 2002 and is incorporated by reference.

BACKGROUND OF THE INVENTION

1. Field of the Invention

This invention provides electronic design automation ("EDA") tools for integrated circuit design. Specifically, this invention provides for impedance mismatch of a behavior model during circuit simulation.

2. Related Art

A digital communications link might be modeled according to FIG. 1. In this model, a digital source 100 is coupled to a channel encoder 102. A modulator 104 receives the signal from the channel encoder 102 and transmits the signal across the channel 106. On the receiving end, the demodulator 108 demodulates the received signal and the channel decoder 110 decodes the signal to produce the received data 112. The channel encoder 102 is matched with the channel decoder 112, and the modulator 104 is matched with the demodulator 110. Frequently these matched blocks have similar parameters and require these parameter values be relatively close or matching. Thus, a modulator might have a parameter defining the number of constellation points. The matching demodulator would, in general, be set equal to all constellation points assigned to a particular constellation. However, this does not always have to be the case in order for the two blocks to work in the same system.

In existing system simulators, only the sampled data is propagated from one block to the next for a single connection between blocks. If more information is to be passed, an additional set of model block terminals would be required for each property to be passed. This approach has several problems. The first is that the extra terminal connections would greatly complicate the setup of the system schematic or netlist. A more severe problem is that each model could only pass information that it knew about at the time the model was implemented. This would require that all models that generate this extra information be connected (in the schematic or netlists) to all models that may need this information using an additional set of terminals for each new property type. The additional possible connections could become quite large.

A need exists for the directional connectivity described by the interconnections of the blocks in the schematic or netlist to be used to propagate arbitrary data from one block to another. This propagation of information allows models that are connected to each other to share information that can be used for a variety of purposes such as simplifying the setup of model parameters.

Existing data flow and discrete time based simulation programs assume ideal termination conditions between blocks. For example, the input impedance and output impedance of each block is often assumed to be perfectly terminated with either 50 ohms or some user specified impedance. This assumption can lead to very significant modeling errors in the simulated results. In general, termination impedances are complex frequency dependent functions that result in frequency dependent mismatch losses between the blocks.

SUMMARY

This invention provides directional connectivity described by the interconnections of the blocks in the schematic or netlist that are used to propagate impedance data from one block to another. The propagation of impedance data for discrete time based simulation programs allow for the simulation under less than ideal termination conditions between the blocks. This invention also supports functionality where the input impedance and output impedance of each block are not perfectly terminated. The usual assumption that all blocks are ideally terminated can lead to very significant modeling errors in the simulated results. In general, termination impedances are complex frequency dependent functions that result in frequency dependent mismatch losses between the blocks. This invention allows for the propagation and calculation of impedance mismatches between the various blocks.

Other systems, methods, features, and advantages of the invention will be or will become apparent to one with skill in the art upon examination of the following figures and detailed description. It is intended that all such additional systems, methods, features and advantages be included within this description, be within the scope of the invention, and be protected by the accompanying claims.

DETAILED DESCRIPTION OF THE DRAWINGS

The components in the figures are not necessarily to scale, emphasis being placed instead upon illustrating the principles of the invention. In the figures, like reference numerals designate corresponding parts throughout the different views.

FIG. 31 is a graph illustrating the carrier frequency ($f_c$).

FIG. 32 is a block diagram illustrating the model mismatch before and after the model block.

FIG. 33 is a block diagram illustrating the model mismatch before and after the model block where the model mismatch is treated as a separate block diagram.

FIG. 34 is a block diagram illustrating the calculation of impedances.

DETAILED DESCRIPTION

Figure 1:
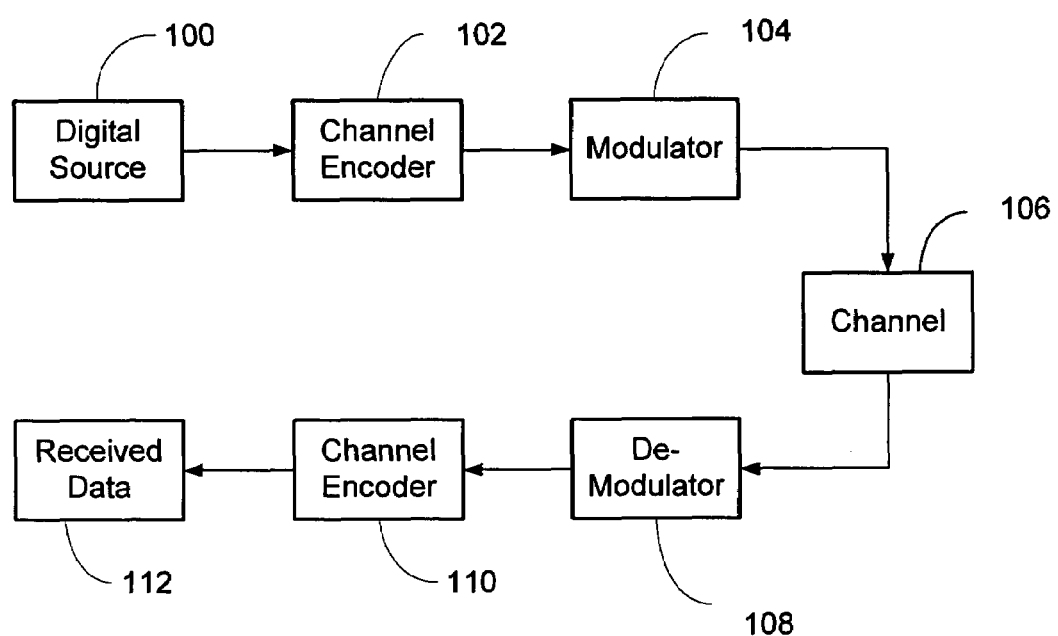
FIG. 1 is a prior art block diagram illustrating a typical digital communications link.

The invention provides for the propagation of the signal information as well as additional information, from one block to the next in a system. This propagation of information in addition to the signal information uses the connectivity of the blocks to propagate certain system or block properties from one block to the next block. A "property" is well known to one skilled in the art. It may be composed of an identifier and a value, where the identifier may be a string, or a numeric value, including pointers, used to uniquely identify the property. The value of the property is the information represented by the property and may come in many different formats, such as a numeric value, a vector of numeric values, text, or a data structure. A typical property may be represented as a name value pair (could be other representations), where the value may be any type of information describing or a characteristic associated with the block. Examples may include another name, a number, a vector, an object pointer, etc.

The block connectivity information of a simulated network may be used to pass (or propagate) arbitrary configuration information or properties from block-to-block. These properties are separate from the data elements passed during the simulation and may be propagated in both the direction of the data element flow (forward propagation, from output nodes to input nodes) and in the reverse direction (back propagation, from input nodes to output nodes). Properties may also be propagated through bi-directional nodes by treating the nodes as both input and output nodes in both forward and back propagation.

The individual blocks often determine the properties propagated by the block. A block may create new properties for propagation and may also pass properties it has received from (1) its input nodes during forward propagation, and (2) from its output nodes during back propagation. These properties may be propagated directly or by modifying the properties before passing the properties through propagation. A decision may also be made to decide not to propagate certain properties.

The propagated properties may be "stacked" as they are passed from block-to-block, allowing one set of blocks to be "enclosed" by another set of similar blocks. The first enclosed block pushes the property set of first output block then propagates its values for that property set. The matching enclosed block retrieves this set of properties and then pops the property set from the outer block, and propagates the popped properties that eventually reach the outer matching block.

The propagation mechanism may also be used to pass block parameter values between blocks. Matching blocks may then use the propagated parameter information to configure their parameters in order to match the settings of the matching block propagating its parameter settings. The propagation mechanism may be used to pass general algorithm information to other blocks, allowing other blocks to dynamically configure their algorithms without relying on knowledge of the originating block's parameters.

The propagation mechanism may be used to pass signal properties such as the time step of a sample, the number of samples per symbol, the data format, the signal delay or the center frequency. Thus, in this configuration, the signal properties may be configured to allow for propagation when the property is applicable or associated to a particular signal.

The propagation mechanism may also be used to request specific behavior from upstream blocks by back propagating desired properties. An upstream block that can provide that behavior configures itself to do so and forward propagates the appropriate properties that eventually reach the requesting block.

In addition to propagating the block or system characteristic properties, the blocks may also alter the value of a propagated property that it receives at its input before it passes it to its output; stop the propagation of certain information so that the properties at the input do not propagate the property to the output; and propagate additional properties to the output that were not received at the input.

In a typical data flow or discrete time simulation, a network is first constructed by selecting blocks representing various components and defining interconnections between the blocks representing the flow of data. These interconnections are typically directional, with one end of the connection identifying an output, while the other end of the connection identifies an input. Hierarchy is also typically supported, where a block can be composed of inner blocks that implement the block's behavior.

When a simulation is run, one or more source blocks generate sequences of data elements. These sequences of data elements are passed through any of the connections whose output end is the source block. The connections pass the data elements on to the blocks at the input ends of the connections. The blocks receiving the data elements then process these data elements, and may generate additional sequences of data elements that are passed onto other blocks connected to the processing block's outputs.

In a typical data driven or discrete time simulator, the blocks of the network are visited to allow the blocks to perform various tasks based on the state of the simulator. Example states of the simulator are (1) initialization, (2) simulation startup, (3) parameter loading, (4) simulation run, and (5) simulation completion. Simulation initialization is when the blocks are visited for the first time by the system simulator. Simulation startup is when the blocks are informed that a simulation is being started. Parameter loading is when the blocks load their parameter values and configure their internal state for the simulation run. Simulation run is when the blocks generate, process and consume simulation data samples. And, simulation completion is when the blocks are allowed to perform end-of-simulation tasks such as gathering overall statistics. The simulation run state is where most of the simulation time is spent.

Property propagation is typically performed prior to the simulation startup and the parameter loading states. This is because property propagation is used primarily for configuring the blocks prior to the start of a simulation run. Properties are not propagated during the simulation run because property propagation is typically a time consuming process.

Figure 2:
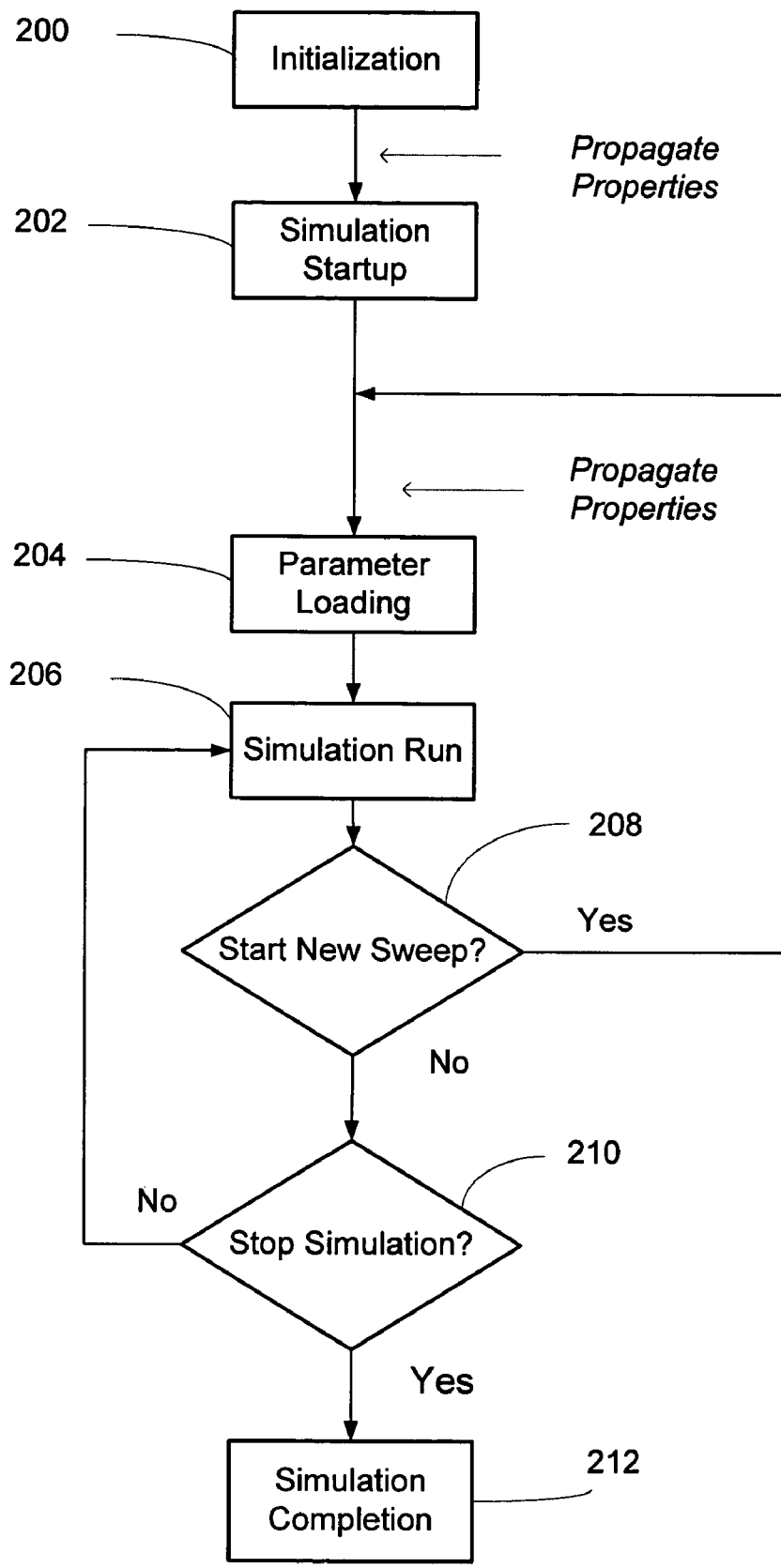
FIG. 2 is a flow chart illustrating the property propagation in the simulation process.

FIG. 2 is a block diagram illustrating the simulation sequence of events. The simulation is initialized 200 and the simulation is started 202. The parameters are loaded 204 and the simulation begins running 206. The simulation inquires as to whether a new sweep should be started 208. If so, the simulation returns and loads a new set of parameters 204 or loads the next set of parameters. If not, the simulation inquires as to whether the simulation should be stopped 210. If so, the simulation stops 212. If not, the simulation returns to start the simulation 206. Properties may be propagated between the initialization stage 200 and the startup stage prior to the loading of the parameters 204.

When a block generates data samples, the simulation typically writes the samples to the block's output nodes or ports. The simulator is typically responsible for managing those data samples and sending them to the input nodes connected to that output node. The connections between an output node and any input nodes typically determine the data flow paths between blocks.

The property propagation methodology may be implemented using a variety of schemes where the blocks are visited in some prescribed order. Depending upon the direction of propagation, when a block is visited, the block may either read properties from its input nodes (forward propagation) or from its output nodes (back propagation). The block can decide to propagate all properties, only some properties, or no properties at all. The block may also change the values of any of the properties and/or add new properties. The block then propagates the desired properties by sending them to either the output nodes (forward propagation) or the input nodes (back propagation). The simulator is responsible for passing the propagated properties from one block to the other.

The basic algorithm for the visitation driven property propagation implementation may be described generically as:

1. Update the enable state of all blocks (including inner blocks).
2. Determine the order of visitation.
3. Visit each block in the order determined by step 2, requesting they propagate their properties in the appropriate direction(s).
4. Property propagation is complete if all blocks indicated they propagated their properties.

The basic visitation algorithm applies to the forward and backward directions separately. The simulator maintains two sets of properties, one for the forward direction and one for the backward direction.

Figure 3:
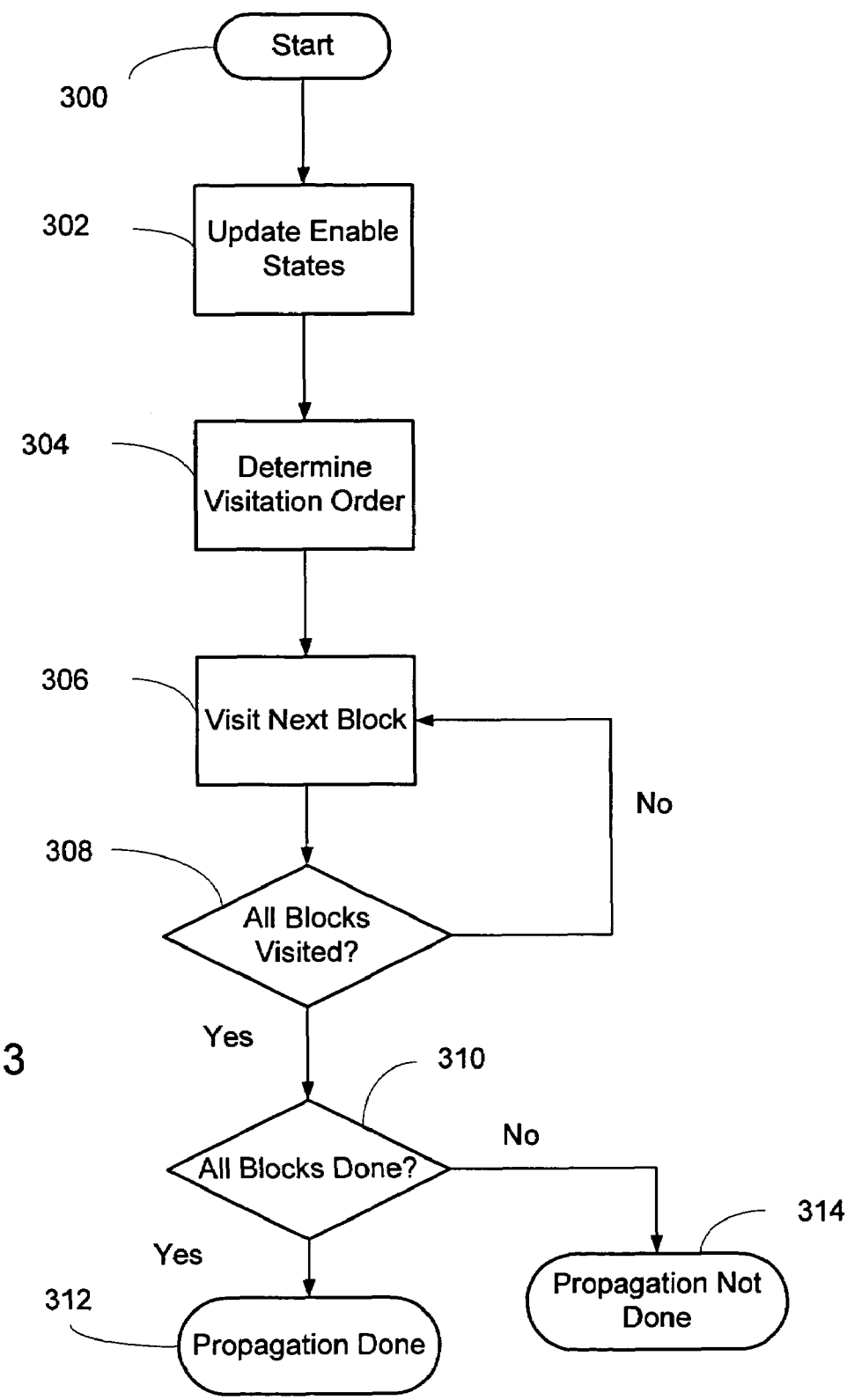
FIG. 3 is a flow chart illustrating the visitation of blocks in the propagation scheme.

FIG. 3 is a block diagram illustrating the implementation of a propagation scheme. The process starts 300 and updates the enable states 302. This ensures that the various states of the blocks are up to date. A determination is made of the visitation order 304 and the simulation visits each block 306 according to the visitation scheme selected in block 304.

Ideally blocks are visited in the order in which properties are propagated. For the forward direction this means that source blocks would be visited first, followed by blocks receiving input directly from those source blocks. Sink blocks would be visited last. For the backward direction, sink blocks would be visited first, followed by blocks whose outputs are connected to those sink blocks. Source blocks would be visited last.

In terms of ordering visitation, any block that doesn't receive input is treated as a source block. This includes blocks that have input nodes but with none of the input nodes connected to an enabled block. Likewise, sink blocks are any blocks that do not send output to another block. This includes blocks that have output nodes with none of the output nodes connected to an input node of an enabled block.

Individual blocks can also request to be treated as a source for the forward direction and/or as a sink for the backward direction. This is necessary for the blocks that prime feedback loops, such as delay blocks. In the case of delay blocks in feedback loops, the delay block needs to be treated as a source block for forward propagation direction and as a sink block for the backward propagation. At the same time, the delay block should be treated as a normal block with inputs and outputs if the block is not part of a feedback loop.

The simulation inquires whether all of the blocks have been visited 308. If not, the simulation returns to visit the next block 306. If so, the simulation inquires whether all the blocks have completed processing the properties received 310. If so, the simulation propagation is completed 312. If not, the simulation propagation is not complete 314 and returns 314.

Figure 4:
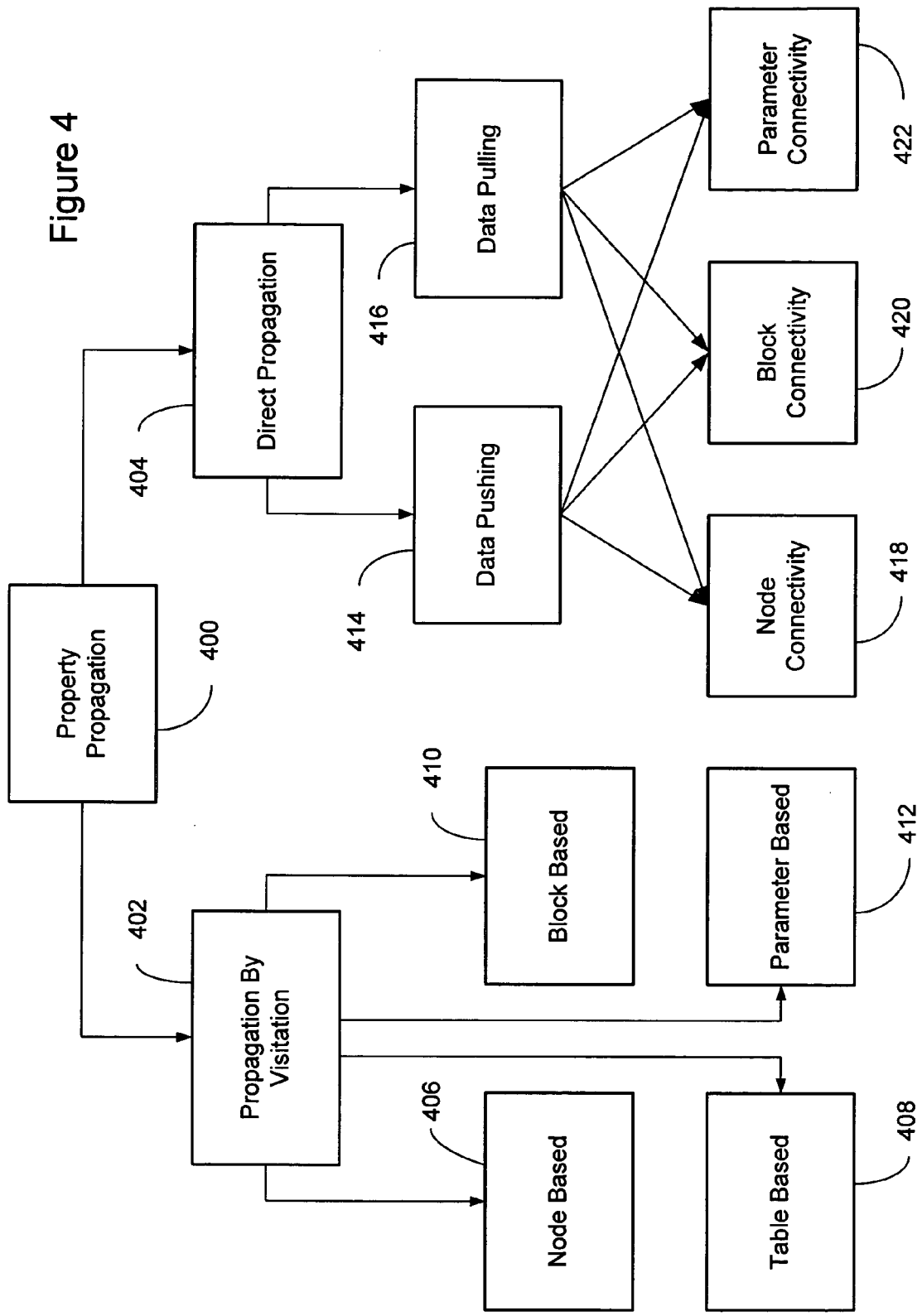
FIG. 4 is a block diagram illustrating various property propagation schemes.

There are several possible ways to implement the property propagation system. FIG. 4 is a block diagram illustrating various property propagation schemes. In FIG. 4, the property propagation methodologies 400 may be achieved via two schemes: (1) propagation by visitation 402 and (2) direct propagation 404. Propagation by visitation 402 may be accomplished by a node-based scheme 406, a table based scheme 408, a block based scheme 410, or a parameter based scheme 412. Direct propagation may be accomplished by data pushing 414 or data pulling 416. Both data pushing 414 and data pulling 416 may be accomplished via node connectivity 418, block connectivity 420 or parameter connectivity 422.

Figure 5:
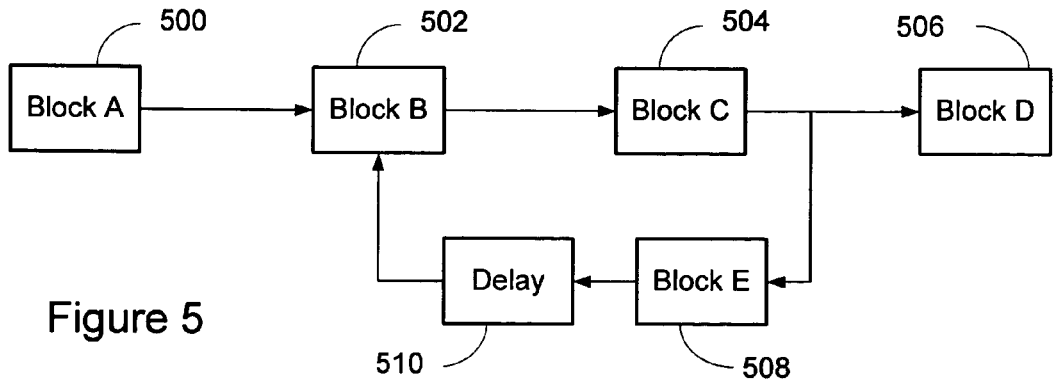
FIG. 5 is a block diagram illustrating a basic block layout of a communication system.
Figure 6:
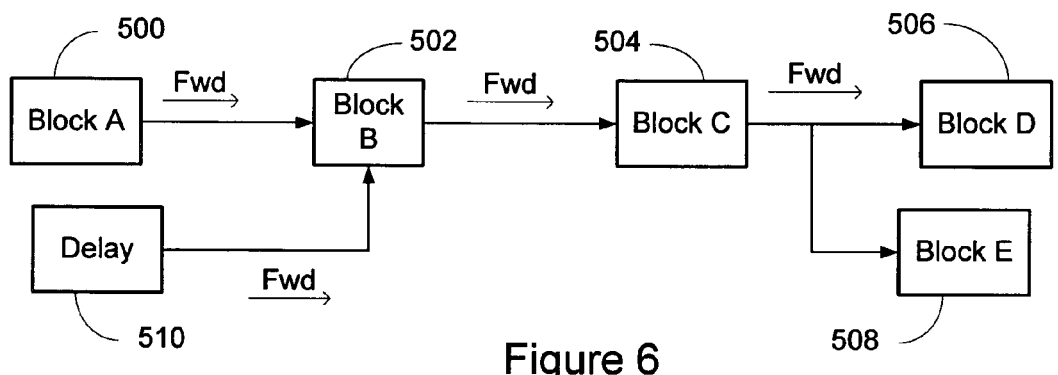
FIG. 6 is a block diagram illustrating a forward propagation of properties in a basic block scheme of a communication system.
Figure 7:
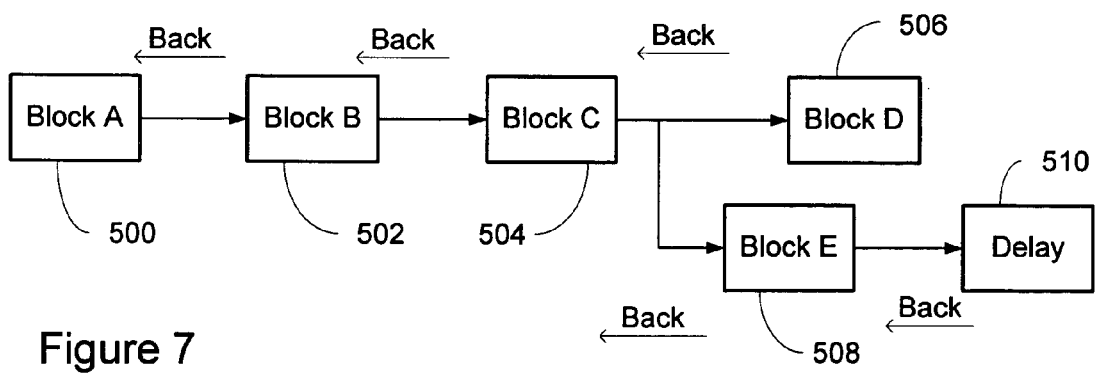
FIG. 7 is a block diagram illustrating a reverse propagation of properties in a basic block scheme of a communication system.

An example of property propagation is illustrated in the block diagrams FIGS. 5-7. FIG. 5 illustrates an example feedback loop with block A (500), B (502), C (504), D (506) and E (508) and one delay block 510. The signal from block C (504) splits sending information to blocks D (506) and E (508). After passing through block E (508), a delay is added and the signal is feed back to block B (502).

FIG. 6 illustrates the forward propagation equivalent layout of FIG. 5. The properties are passed from block A (500) and the delay block 510, to block B (502). From block B (502), the properties are passed to block C (504) and then on to blocks D (506) and E (508).

FIG. 7 illustrates the reverse propagation equivalent layout of FIG. 5. The delay block propagates property information to block E (508). The property information from blocks E (508) and D (506) are combined and passed to blocks C (504), B (502) and A (500), respectively.

Figure 8:
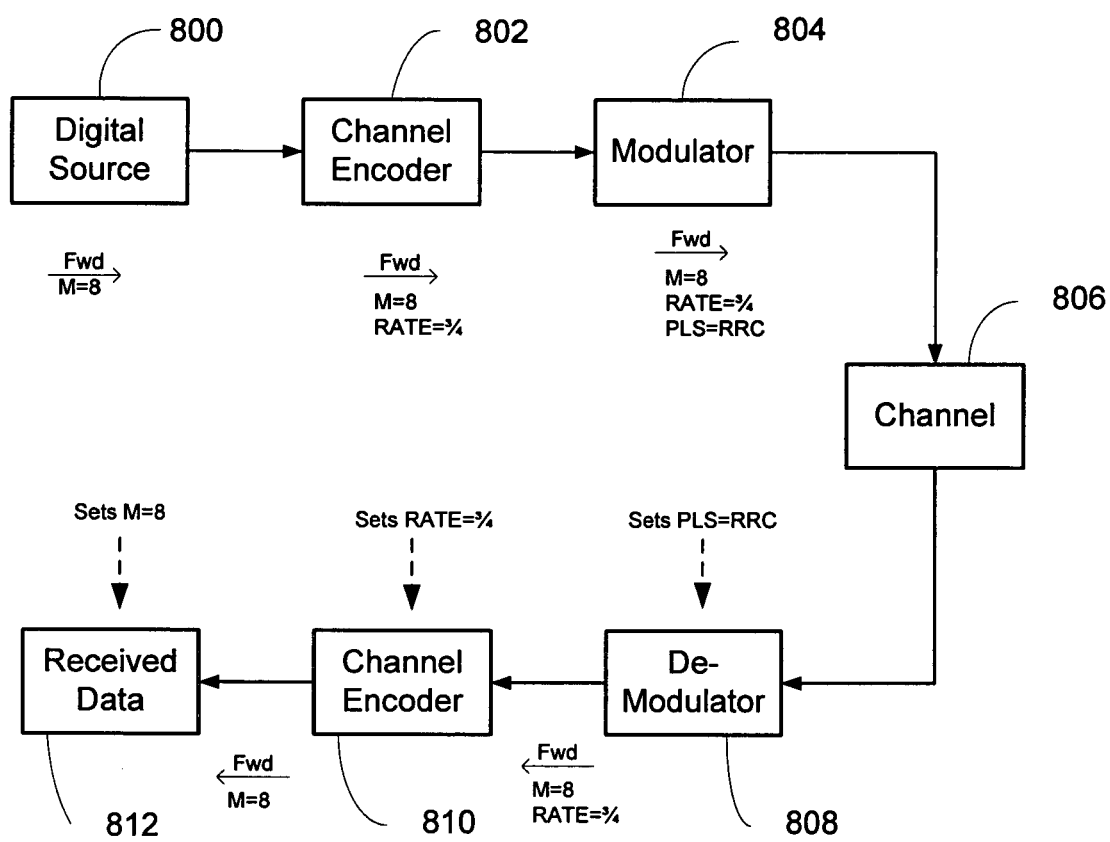
FIG. 8 is a block diagram illustrating the forward propagation of properties in a basic communication system.

FIG. 8 is a block diagram illustrating a simple communication system. A source 800 has the property M=8 that is forwarded to a channel encoder 802 having a rate of ¾. A modulator 804 has a PLS=RRC. In this example, the simulation forwards the property M=8 from the source 800 and propagates the characteristic property to the channel encoder 802 and the modulator 804. The simulation also propagates the Rate=¾ from the channel encoder 802 to the modulator 804. The modulator 804 detects the property M=8 and selects the appropriate constellation. These system properties are next propagated across the channel 806 to the receiver. In the receiver, the rate of the demodulator 808 is set at PLS=RRC and the constellation selected for M=8, while the Rate and M are forwarded to the channel decoder 810 and the received data block 812, respectively.

Order of Visitation Implementation:

The order of visitation step of the algorithm may be implemented in several ways. In all cases, the goal is to obtain a means of visiting each block in the desired order. One method is the list-based method. It consists of building a list of the blocks in the order in which the blocks are to be visited. Another method is the DAG-based method. It consists of constructing a directed acyclic graph (DAG) from the blocks in such a way that the desired visitation order is obtained when walking the graph breadth first.

List-Based Visitation:

List-based visitation utilizes a single list of blocks for each direction of propagation. The lists are constructed such that blocks that should receive properties from another block appear before the other block in the list. For the forward propagation direction this results in a list where all source blocks appear first in the list. For the backward propagation direction this results in a list where all sink blocks appear first in the list. In general, the list for the backward propagation direction cannot be assumed to be the reverse of the list for the forward propagation direction due to the possibility of feedback loops and multiple blocks feeding into a single block.

Once the list has been constructed the blocks are visited by walking the list from the front to the back.

The following pseudo-code illustrates the list based scheduling algorithm:

```
1.   Procedure OrderBlocks(List visitList)
2.   // On exit visitList is the list of blocks in order of visitation.
3.   List toCheckList
4.   List availBlocks
5.   // Sort all the blocks.
6.       // Blocks to be treated as sources are added to visitList and to
             toCheckList.
7.       // All other blocks are added to availBlocks.
8.       for each block
9.           if forward then
10.              if NoInputsConnected(block) OR
                    TreatAsFwdSource(block) then
11.                  visitList.AddBack(block)
12.                  toCheckList.AddBack(block)
13.              else
14.                  availBlocks.AddBack(block)
15.              endif
16.          else
17.              if NoOutputsConnected(block) OR
                    TreatAsBackSink(block) then
18.                  visitList.AddBack(block)
19.                  toCheckList.AddBack(block)
20.              else
21.                  availBlocks.AddBack(block)
22.              endif
23.          end if
24.      end for
25.
26.      // Add the blocks connected to the source blocks to the list.
27.      while NOT toCheckList.Empty( )
28.          tmpBlock = toCheckList.PopFront( )
29.          AddConnectedBlocks(tmpBlock.OutNode( ), visitList,
                availBlocks, toCheckList, forward)
30.      end while
31.
32.      // Add any remaining blocks.
33.      while NOT availBlocks.Empty( )
34.          visitList.AddBack(availBlocks.PopFront( ))
35.      end while
36.  end procedure
37.
38.  procedure AddConnectedBlocks(Block block, List visitList,
     List availBlocks, List toCheckList, Bool forward)
39.      NodeList nodeList
40.      If forward nodeList = block.OutputNodes( )
41.      Else nodeList = block.InputNodes( )
42.      For each node in nodeList.Node( )
43.          for each connection in node.Connection( )
44.              Block block
45.              if forward then block = connection.DstBlock( )
46.              else block = connection.SrcBlock( )
47.              if NOT block.Enabled( ) continue
48.
49.              if availBlocks.Get(block) then
50.                  // Get( ) removes the block from availBlocks
                        so we don't do this again
51.                  visitList.PushBack(block)
52.                  AddConnectedBlocks(block, visitList,
                        availBlocks, toCheckList, forward)
53.              Else
54.                  // The block receives input(output) from the
                        block at the end of the list,
55.                  // move the block and all blocks downstream
                        after that block.
56.                  MoveBlocksToEnd(block, visitList)
57.              endif
```

```
58.            end for
59.         end for
60. end procedure
```

There are several key elements to the above listed algorithm. The use of source/sink, output/input and input/output indicates that the word preceding the '/' is for the forward direction and the word following is for the backward direction. The following is a description of the pseudo-code:

1. The first for-loop, pseudo-code lines 8 through 24, sorts the blocks into source/sink blocks and all other blocks. The source/sink blocks are added to the order list 'visitList' as they are encountered, while the other blocks are added to a list of blocks that haven't been sorted, availBlocks. The availBlocks list is used to keep track of what has or hasn't been sorted—blocks in availBlocks have not been sorted.
2. The source/sink blocks are also added to a second list of blocks toCheckList, that is used to queue up blocks to be processed.
3. The TreatAsFwdSource( ) (pseudo-code line 10) and TreatAsBackSink( ) (pseudo-code line 17) determine if a block has requested that it be treated as a source for the forward direction or a sink for the reverse direction.
4. The second loop (pseudo-code lines 27 through 30) processes each block in toCheckList by calling AddConnectedBlocks( ) to perform the processing.
5. AddConnectedBlocks( ) loops over each output/input node of the block (pseudo-code lines 42 through 60) and checks each block connected to the output/input node.
   a. If the block has not been sorted (it is still in availBlocks), the block is removed from availBlocks, added to the end of the order list visitList, then AddConnectedBlocks( ) is called recursively on the block. This has the effect of moving all blocks connected along a data path to the order list.
   b. If the block has already been sorted, the block along with all blocks downstream/upstream from it are moved to the end of the sort list and their original order is maintained. This has the effect that when two data paths into a block share a common source, the blocks are properly ordered.

DAG-Based Visitation:

Directed acyclic graph based visitation represents the flow of properties utilizing a DAG. Again a separate DAG is used for the forward and backward propagation directions. When represented as a DAG, the blocks are the vertices, and the paths of property flow are edges. For the purposes of this discussion, a block that sends properties to another block is a source vertex, while the block that receives those properties is a destination vertex. A block that does not receive properties from any other block is a root vertex.

Much of the DAG can be constructed directly from the node connectivity graph. Source blocks and blocks with no connected inputs/outputs (again using the '/' to indicate the forward and backward directions) are treated as root vertices. Blocks that indicate they should be treated as source/sink blocks must also be treated as root vertices. This may be accomplished simply by removing any incoming edges to such blocks.

Figure 10:
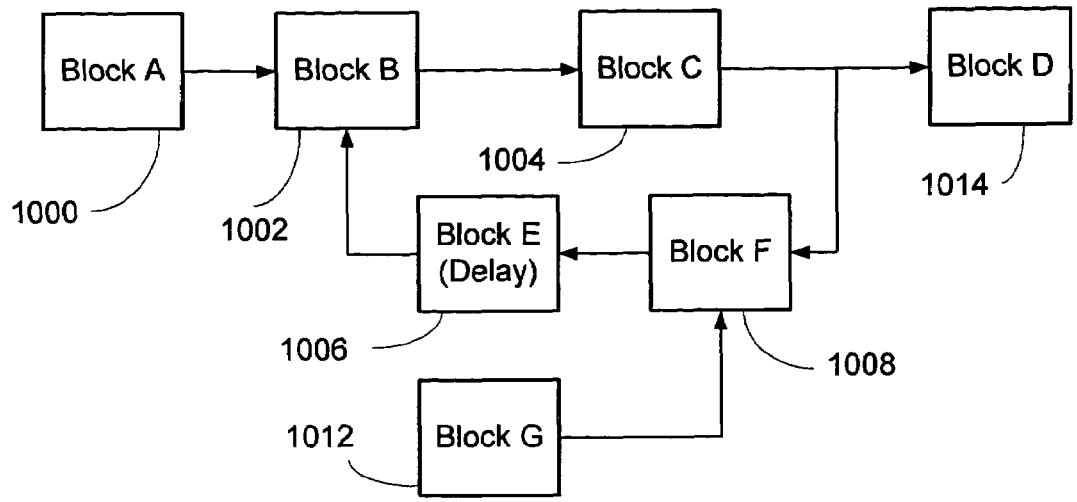
FIG. 10 is a block diagram illustrating a property propagation system using a Directed Acyclic Graph ("DAG").
Figure 11:
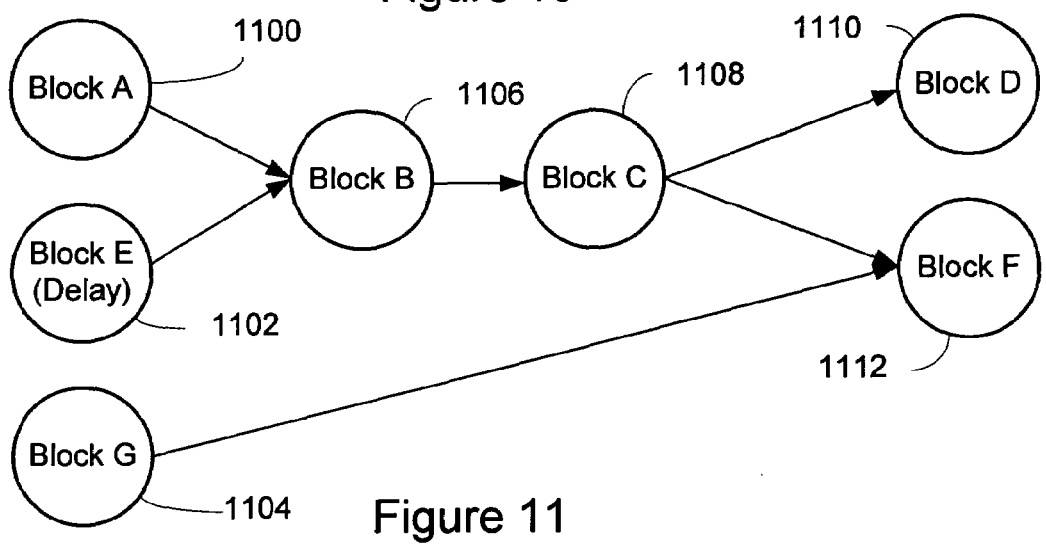
FIG. 11 is a block diagram illustrating an example of a forward property propagation system using a Directed Acyclic Graph ("DAG").
Figure 12:
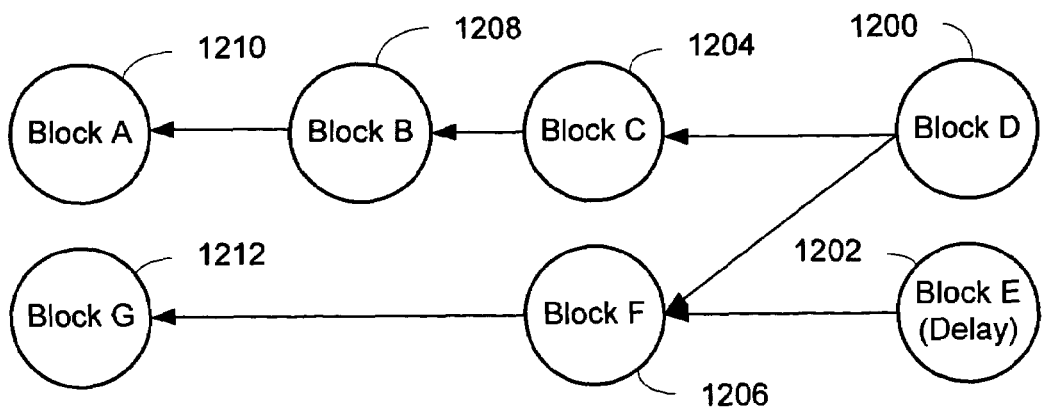
FIG. 12 is a block diagram illustrating an example of a reverse property propagation system using a Directed Acyclic Graph ("DAG").

FIGS. 10, 11 and 12 illustrate how a network topology can be modeled as DAGs. FIG. 10 is a network with a feedback loop and a second source feeding into the feedback loop. The network topology has block A (1000) connected to a feedback loop comprising blocks B (1002), C (1004), E (1006) and F (1008), with Block E (1010) being a delay block. Block G (1012) is a second source feeding into the feedback loop. Block D (1014) is connected to receive the output from the feedback loop. The delay block E (1010) is used to 'break' the feedback loop, and indicates that it should be treated as a source/sink block.

FIG. 11 illustrates one way the forward propagation direction may be modeled as a DAG. Blocks A (1100), E (1102) and G (1104) are the roots of the graph, the propagation of properties start there. Blocks A (1100) and E (1102) are connected to block B (1106). Block B (1106) is connected to block C (1108) and block C (1108) is, in turn, connected to blocks D (1110) and F (1112). Also connected to block F (1112) is block G (1104).

FIG. 12 illustrates one way the backward propagation direction may be modeled as a DAG. In this example, blocks D (1200) and E (1202) serve as the roots of the graph. Block D (1200) is connected to blocks C (1204) and F (1206). Also connected to block F (1206) is delay block E (1202). Block C (1204) is connected to block B (1208) and block B (1208) is, in turn, connected to block A (1210). Block F (1206) is connected to block G (1212).

Once the graphs have been constructed, visitation may be performed by walking the graph starting from the roots. Accommodations must be made to ensure that blocks that receive properties from multiple blocks are visited at least once after those multiple blocks have been visited. For example, in FIG. 11, block F (1112) would need to be visited after blocks A (1100) and G (1104) have been visited. This does not mean that block F (1112) cannot be visited before, just that it should be visited at a later time since the properties available to it may be different.

A simplistic approach is to recursively visit the destination blocks connected to a block after that block has been visited. However, this approach typically becomes unwieldy for topologies that contain many interconnections and source blocks because downstream blocks may end up being visited several times.

Another approach would involve marking the blocks as they are visited, and only visiting blocks when all the property sources to the block have been marked as visited. Destination blocks of a block would only be checked and visited after the block has been visited.

There are many DAG traversal algorithms available to one skilled in the art, and any of these may be chosen provided they guarantee that destination vertices of the DAG are visited at least once after the source vertices.

Other Visitation Algorithms:

There are many algorithms available in the art for constructing and traversing collections of objects. For example, one could maintain a list of all blocks in the network topology, and visit each block in the list. When a block indicates that it has completed propagation the block could be removed from the list. The list would be continually traversed until either there were no changes to the list (propagation failed) or the list was empty (propagation succeeded).

The order of visitation step may be implemented by one of the many algorithms available for traversing collections of objects, provided that the algorithm chosen allows for the visitation of blocks that receive properties from another block be visited at least once after the block generating the properties has generated its properties.

This methodology allows model blocks to be created that can automatically send information to other blocks down the system chain. This is useful for many purposes such as:

1. Sampling rates and time steps can be propagated so that only the source blocks need to be specified. Blocks that change the sampling rate or time steps may modify these properties automatically, thus simplifying the configuration of the blocks and reducing errors.

2. Many system blocks are typically paired together. For example, a transmitter is often connected to a channel model that is then connected to a receiver as shown in FIG. 8. There are many settings (such as constellation size, pulse shaping, power levels, etc.) that are set in the transmitter block that must also be set to the same values in the receiver block. There may also be parameters of the receiver that could be computed with some algorithm given the properties propagated from the transmitter block and/or properties from other blocks downstream from the receiver. Property propagation allows for the creation of "Smart Blocks" that automatically configure themselves based on their configuration to other blocks and systems. In the example above, the receiver block does not require any user specified properties, thus, it may be configured using information propagated from downstream blocks. This simplifies the setup and reduces user error during system simulation.

Individual model blocks can be constructed from multiple existing model blocks, and the choice of which model block to use can be determined from the propagated property. For example, a smart receiver may work with any modulated source independent of the modulation format (QAM, QPSK, WCDMA, etc . . . ). If there was a receiver model block for each of the different formats, then a "smart receiver" may be easily constructed from all of these blocks. The smart receiver would choose the specific receiver based on a property propagated from the transmitter that indicated the type of transmitter.

Main Algorithm:

For the top-level network, where the network is not a sub-circuit or composite block, the basic algorithm is modified to accommodate a variety of special conditions. The algorithm includes an inner loop where forward and back propagation is alternated, thus allowing the blocks to request the propagation pass be repeated.

Figure 9:
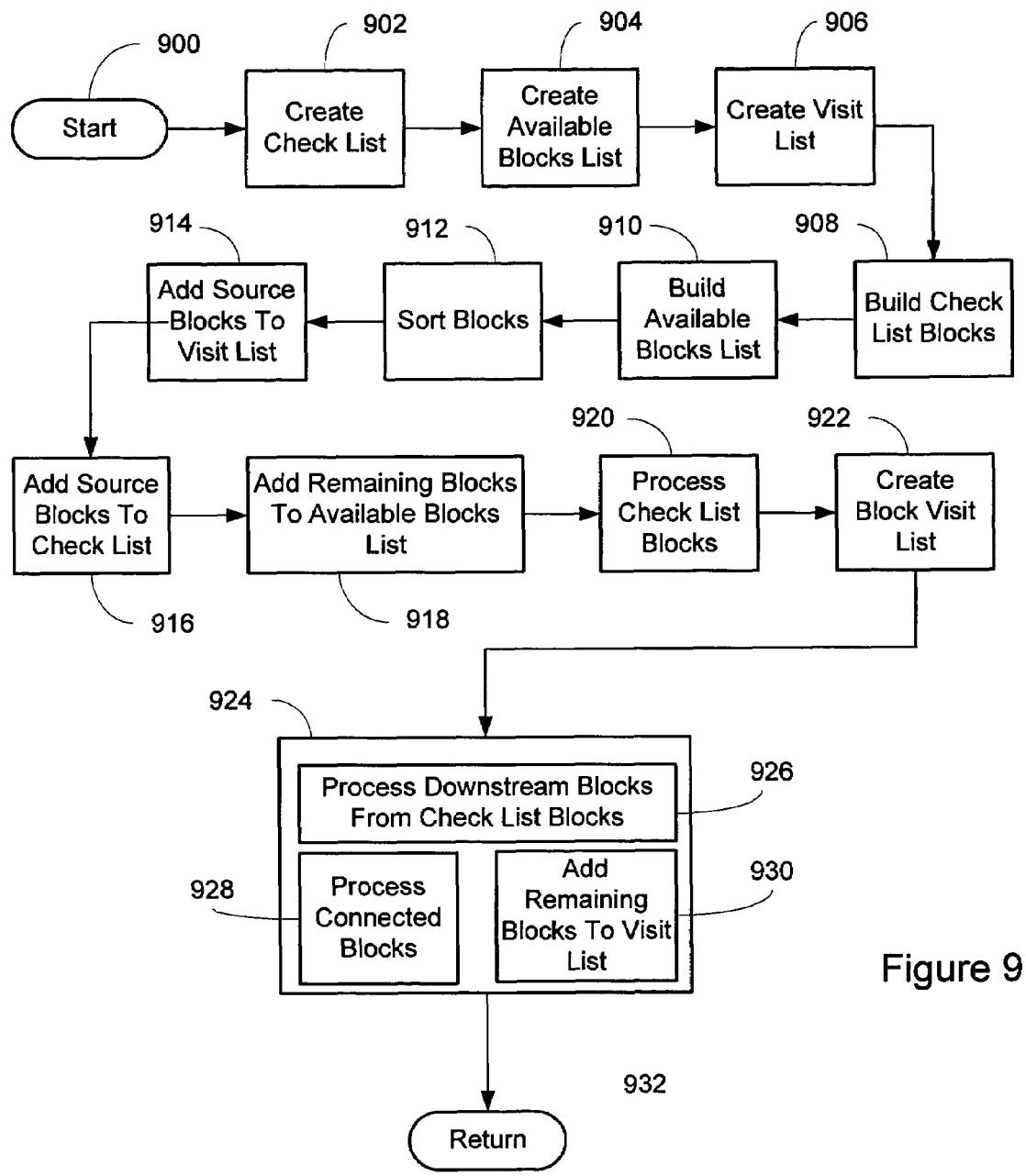
FIG. 9 is a block diagram illustrating an example algorithm creating a visit list.
Figure 13:
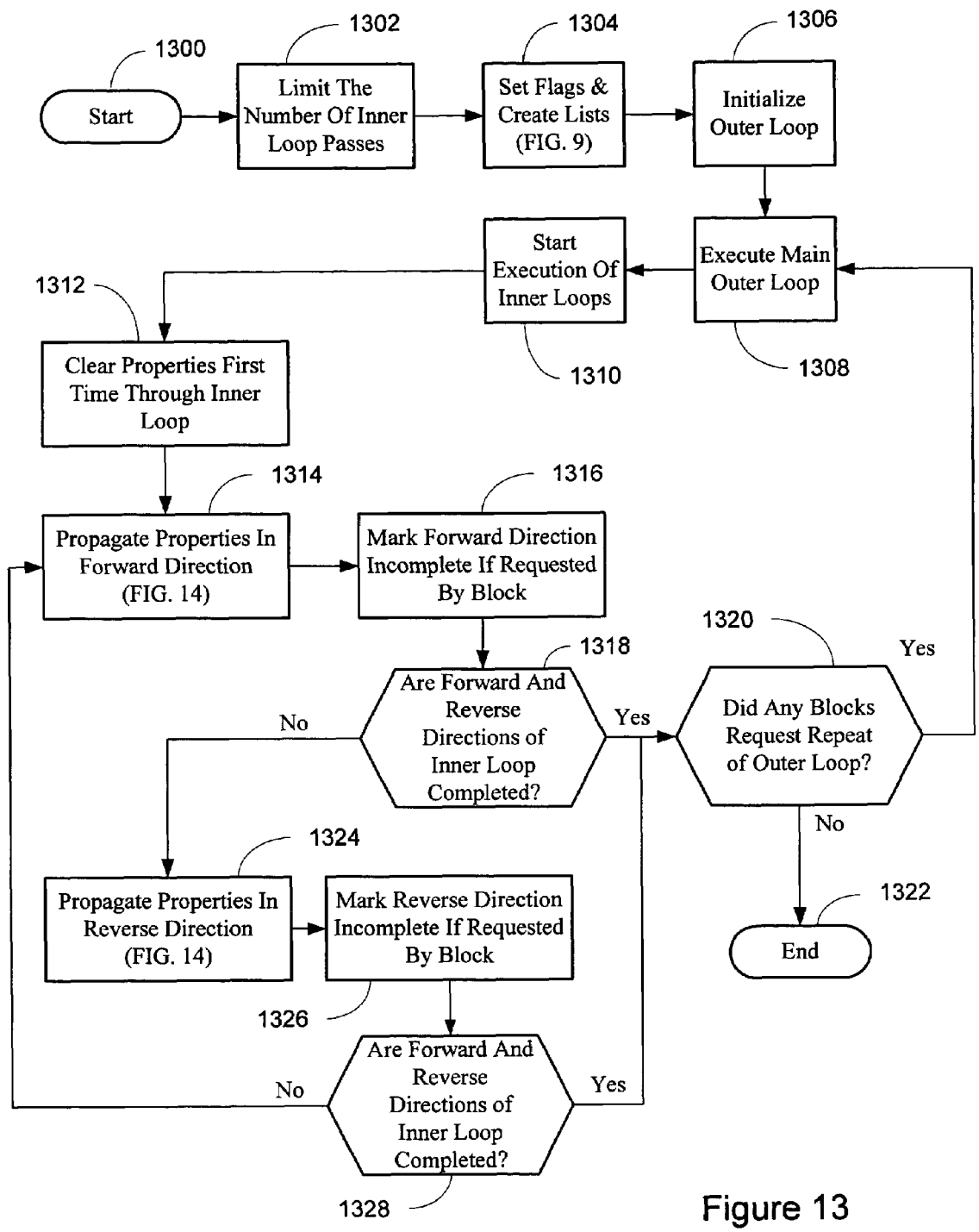
FIG. 13 is a block diagram illustrating the main routine for a property propagation system.

In FIG. 13, the main property propagation algorithm starts 1300 and the number of inner loops passes are limited. Certain flags are set and lists are created (see FIG. 9). The outer loop is initialized 1306 and the main loop executes 1308. The main loop initializes the execution of the inner loops 1310 and clears the properties the first time through the loop 1312. The properties are propagated in the forward direction as illustrated in FIG. 14.

Figure 14:
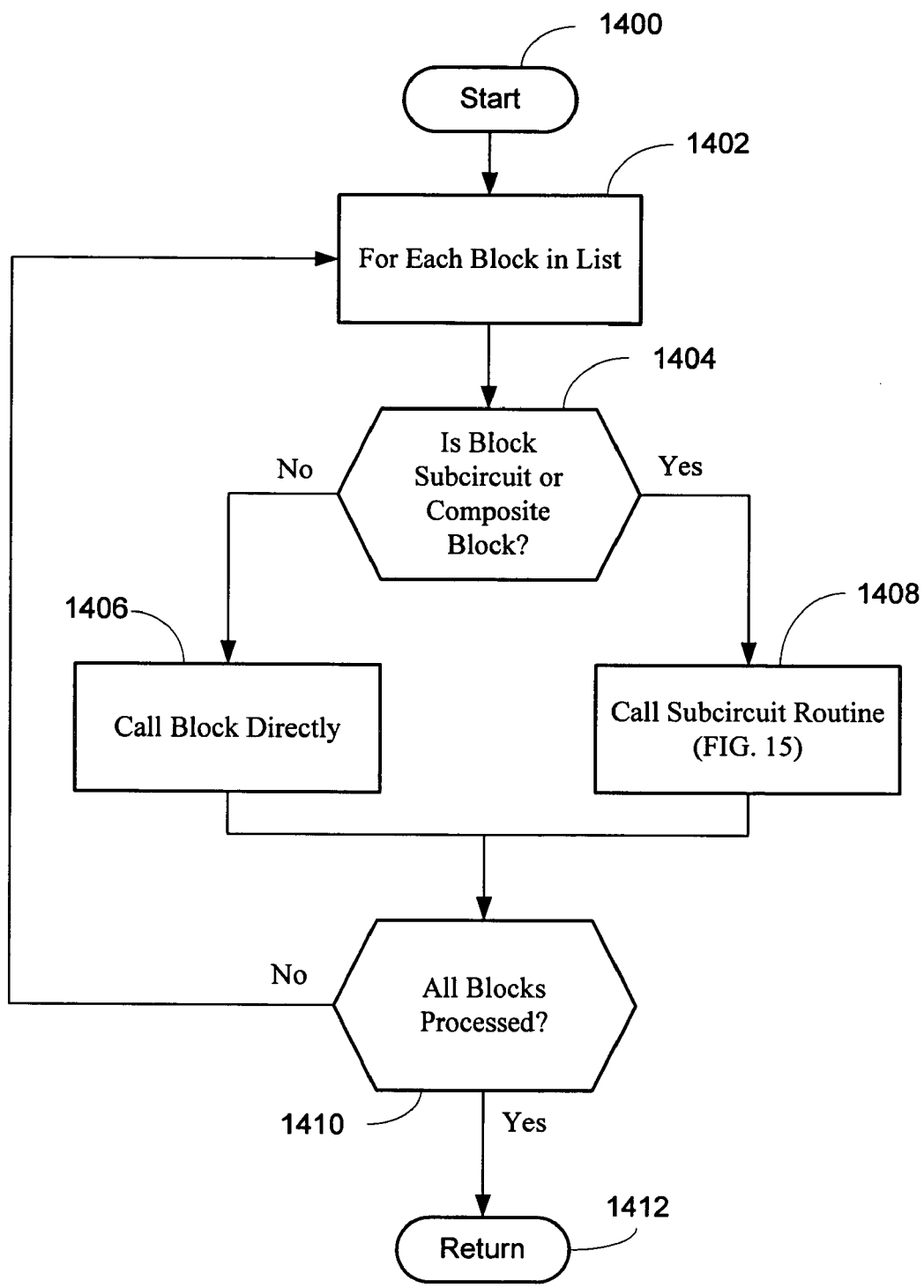
FIG. 14 is a block diagram illustrating the propagation of properties in the forward or reverse directions.
Figure 15:
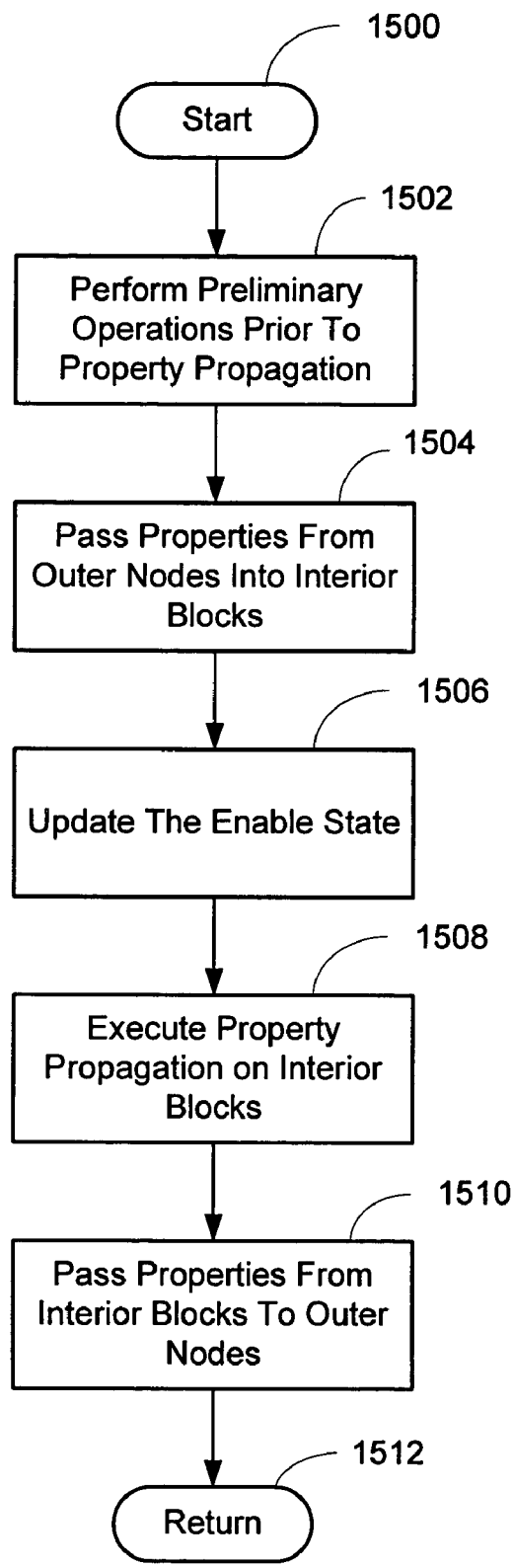
FIG. 15 is a block diagram illustrating sub-circuit or composite block routine.

FIG. 14 illustrates the propagation of the block properties and typically starts from the main program 1400. The algorithm determines for each block in the list 1402 whether the block is a sub-circuit block 1404. If the block is not sub-circuit block, the block is called directly 1406. Otherwise, the sub-circuit routine illustrated in FIG. 15 is called 1408. If all of the blocks are not processed, the algorithm returns to analyze the next block 1402. Otherwise, the algorithm returns to the main program illustrated in FIG. 13.

When the algorithm returns to the main program 1314, it marks the forward direction as incomplete if requested by a block 1316. Next, a determination is made as to whether the forward and reverse directions of the inner loop is completed 1318. If so, the algorithm determines whether any of the blocks are requesting a repeat of the outer loop 1320. If so, the algorithm returns to execute the main outer loop 1308 again. If not, the main routine ends 1322.

If the forward and reverse directions of the inner loop is not completed 1318, the properties are propagated in the reverse direction 1324, again executing the routine illustrated in FIG. 14, and it marks the reverse direction is incomplete if requested by the block 1326. The algorithm then inquires as to whether the forward and reverse directions of the inner loop is completed 1328. If not, the algorithm returns to propagate the properties in the forward direction according to FIG. 14 (1314). Otherwise, the algorithm proceeds to determine whether any of the blocks requested a repeat of the outer loop 1320.

FIG. 15 illustrates the sub-circuit routine. The sub-circuit routine starts 1500 and performs preliminary operations prior to the propagation of any properties 1502. The properties are then passed from the outer nodes into the interior blocks 1504 and the enable state is updated 1506. The properties are then propagated on the interior blocks 1508 and the properties are passed from the interior blocks to the outer nodes 1510. The sub-circuit routine then returns to the main algorithm 1512.

The following pseudo-code illustrates the algorithm and correlates to FIGS. 13-14:

```
1.   ResetPropagation( )       // All stored properties are deleted, inner
                                  blocks are also reset.
2.   UpdateEnableState( )      // Connections to disable blocks are disabled.
                                  Also applies to inner blocks.
3.   BuildForwardList( )       // Determine order of visitation for forward
                                  direction.
4.   BuildBackwardList( )      // Determine order of visitation for backward
                                  direction
5.   maxInnerLoops = Blocks.size( )   // Limits the number of inner
                                         loops.
6.
7.   // Loop for repeating the full propagation pass.
8.   numPasses = 0
9.   repeat
10.     fwdDone = false
11.     backDone = false
12.     fwdPropsChanged = false
13.     backPropsChanged = false
14.     fwdFlushed = false
15.     backFlushed = false
16.
17.     // Inner loop to allow properties to propagated from sources to
           sinks and vice-versa.
18.     innerLoop=0
19.     while innerLoop<maxInnerLoops
20.        if NOT fwdDone then
21.           // Reset the forward direction properties if we're starting a
                new pass
22.           // so we don't have left-over properties from the previous
                pass.
23.           if backPropsChanged AND NOT fwdFlushed then
24.              ClearForwardProperties( )
25.              fwdFlushed = true
26.           end if
27.
28.           // Visit all the blocks in the forward direction ordering.
29.           fwdDone = FwdPropagateProperties( )
30.           // Allow blocks to request a repeat of the inner loop.
31.           if BlockReqMarkFwdIncomplete( ) then fwdDone = false
32.           if fwdDone AND backDone then exit innerLoop
33.
34.        end if
35.
36.        // Determine if any forward direction properties were changed
37.        fwdPropsChanged = ForwardPropertiesChanged( )
38.
39.        if NOT backDone then
40.           // Reset the backward direction properties if we're starting a
                new pass
```

```
41.      // so we don't have left-over properties from the previous
             pass.
42.      if fwdPropsChanged AND NOT backFlushed then
43.         ClearBackwardProperties( )
44.         backFlushed = true
45.      endif
46.
47.      // Visit all the blocks in the backward direction ordering.
48.      backDone = BackPropagateProperties( )
49.
50.      // Allow blocks to request a repeat of the inner loop.
51.      if BlockReqMarkBackIncomplete( ) then fwdDone = false
52.      if fwdDone AND backDone then exit innerLoop
53.      endif
54.
55.      // Determine if any backward direction properties were changed.
56.      backPropsChanged = BackwardPropertiesChanged( )
57.
58.      // Only continue inner loop while properties have been modified.
59.      if NOT fwdPropsChanged AND NOT backPropsChanged
60.         AND innerLoop<>0 then exit innerLoop
61.
62.      innerLoop = innerLoop + 1
63.   end while innerLoop<maxInnerLoops
64.
65.   // By default, PassesToPerform( ) is set to 1. Blocks can request
           additional passes
66.   numPasses = numPasses + 1
67.   if numPasses>PassesToPerform( ) then exit repeat
68.
69. end repeat
70.
71. // We're successful if both the forward and backward directions
        complete.
72. return fwdDone AND backDone
```

For the composite and sub-circuit blocks, the basic visitation algorithm is modified to support the passing of properties between the composite/sub-circuit block and the inner blocks. The following pseudo-code illustrates the algorithm:

```
1.  if compositeBlock then
2.      // Composite block is responsible for passing properties to inner
            blocks.
3.      block.PrePropagateProperties(forward)
4.  else
5.      // Pass properties from the input or output nodes to connected
            inner blocks
6.  if forward then
7.      for each input node
8.          PassPropsToConnectedOutputNodes(inputNode)
9.      end if
10. else
11.     for each output node
12.         PassPropsToCorinectedInputNodes(outputNode)
13.     end if
14. end if
15. end if
16. UpdateEnableState( )   // Connections to disable blocks are disabled.
                             Also applies to inner blocks.
17. // Determine order of visitation
18. if forward then BuildForwardList( )
19. else BuildBackwardList( )
20.
21. if forward then done = FwdPropagateProperties( )
22. else done = BackPropagateProperties( )
23.
24. if done then
25. if compositeBlock then
26.     // The composite block determines what is propagated out.
27.     block.PropagateProperties(forward)
28. else
29.     // Pass properties from the inner blocks to the input or output
            nodes blocks
30.     if forward then
31.         for each output node
32.             PassPropsFromConnectedOutputNodes(outputNode)
33.         end if
34.     else
35.         for each input node
36.             PassPropsFromConnectedOutputNodes(inputNode)
37.         end if
38.     end if
39. end if
40. end if
41. return done
```

Figure 16:
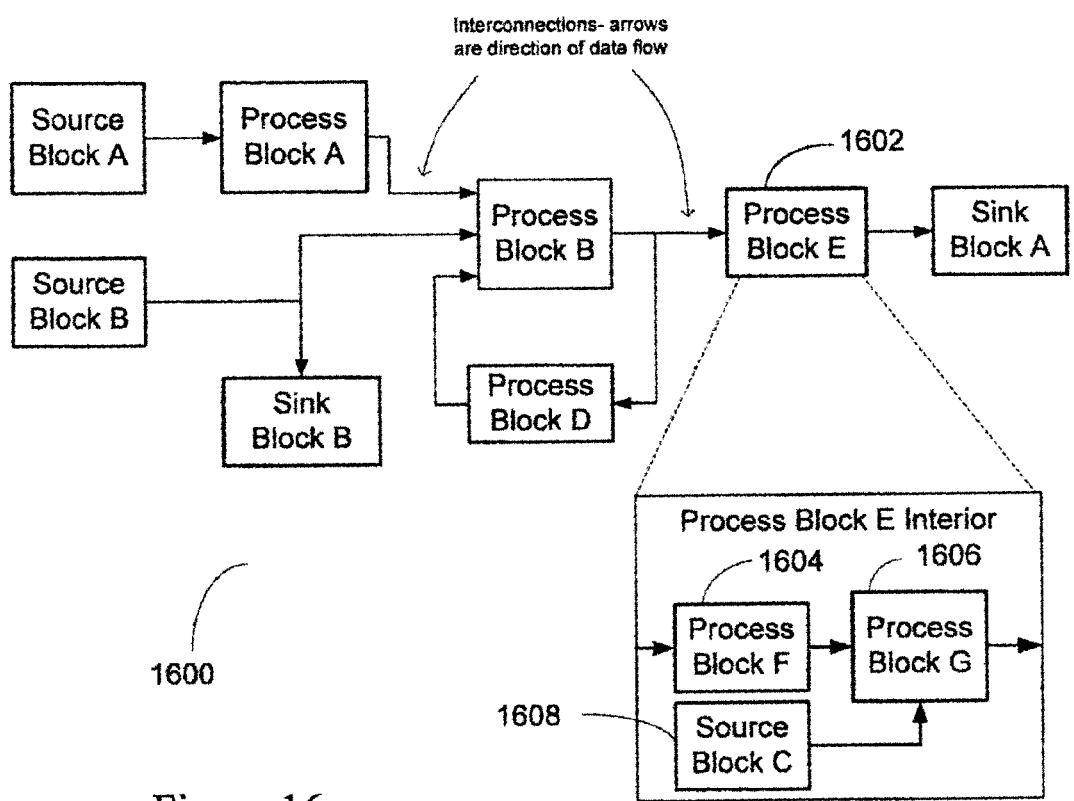
FIG. 16 is a block diagram illustrating the flow of information for a system simulation.

FIG. 16 is a block diagram illustrating the flow of information for a system simulation 1600. Individual blocks normally use parameters to control the behavior of the block. Each block may have it's own set of parameters and may optionally also use built-in simulation wide or global parameters. For hierarchical blocks, the outer block 1602 typically determines the parameter settings of the inner blocks 1604, 1606 and 1608, and may be based on the outer block's parameters.

Data sequences passed from one block to another block typically have a predefined set of properties associated with them. Some examples of the associated properties include the type of the data (digital, real, complex, string, etc.), the dimensions (scalar, vector, matrix, etc.), the units (volts, power, etc.) and time step (period of time spanned by one data element).

In many cases, the simulated network contains pairs of blocks that perform matching operations. One block performs an operation on the data sequence, while the other block performs a reverse operation on the data sequence. Often, there are additional blocks located between the two blocks.

A block may also be a composite block, where its algorithm is performed primarily through a plurality of other inner blocks comprising the outer block. A composite block may choose to pass some or all properties to the inner blocks by using the data paths to allow them to process the properties. The block may also choose to use the properties propagated by the inner blocks.

Hierarchical blocks, or sub-circuits, may also be supported. A hierarchical block is similar to a composite block in that the algorithm is performed by other inner blocks contained with the outer block. The main difference is that the sub-circuit is normally not a pre-defined block. Instead it is constructed by the user, or from a library, as any other network might be, with blocks selected and interconnected by the user. The sub-circuit normally has one or more ports used to pass data from blocks within the sub-circuit to the outer network.

For property propagation, a sub-circuit may be considered as a special case of a composite block. In a sub-circuit, all properties are by default propagated to and from the inner blocks. This is not a requirement, though, as the sub-circuits or the port blocks used to pass samples between the networks could provide mechanisms to allow the user to control the properties that are propagated.

Figure 17:
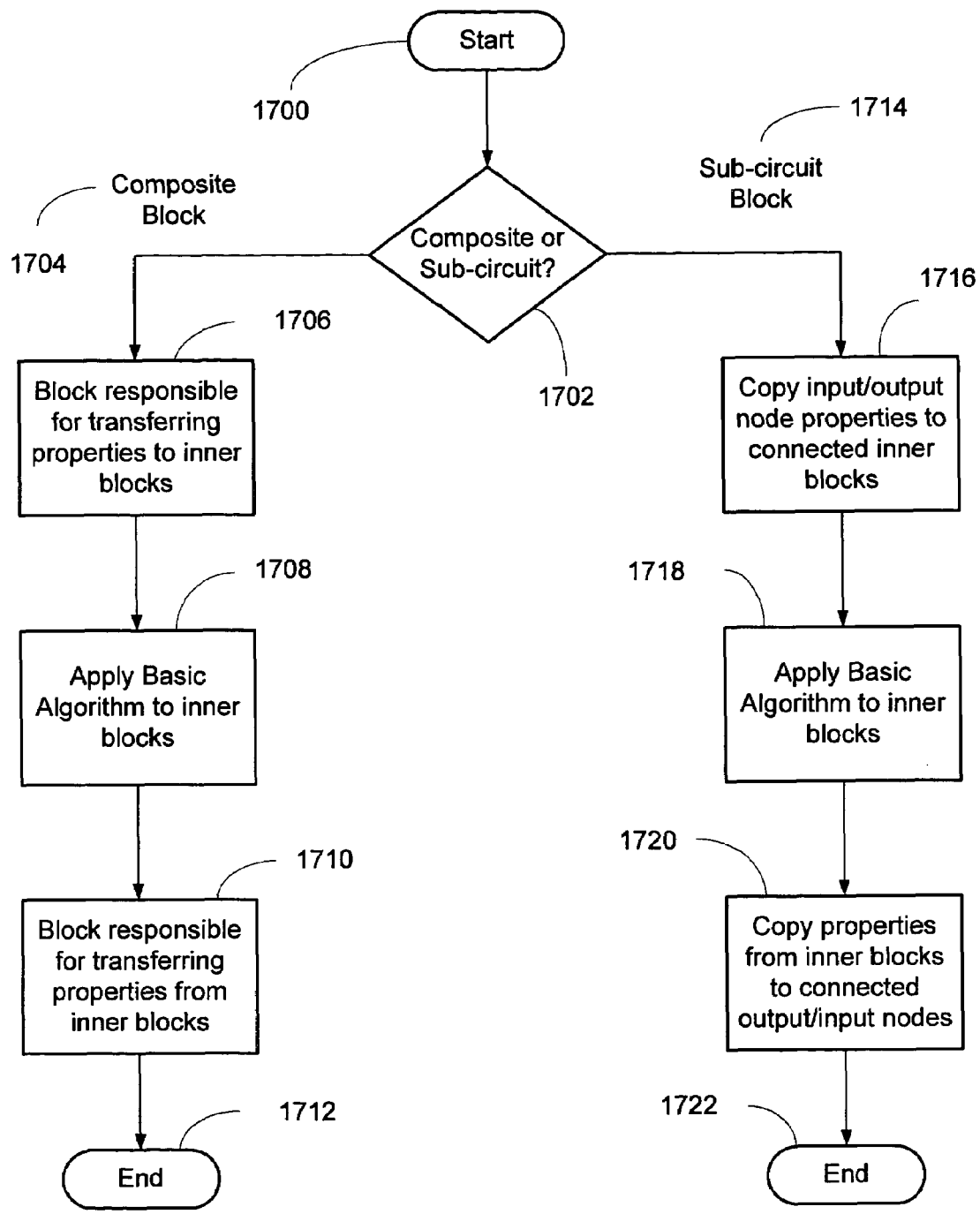
FIG. 17 is a flow chart illustrating the application of algorithms to composite and sub-circuit blocks.

FIG. 17 is a flow chart illustrating the application of algorithms to composite and sub-circuit blocks. The process starts 1700 and determines whether a composite or sub-circuit block exists 1702. If a composite block exists 1704, the block is responsible for transferring properties to and from the inner blocks. The block transfers any desired properties to the inner blocks 1706. Then the basic algorithm is applied to the inner blocks 1708. Next, the algorithm transfers the properties from the inner block to the composite block 1710 and the process ends 1712. If the sub-circuit block exists 1714, the input/output node properties are copied to the connected inner blocks 1716. Then the basic algorithm is applied to the inner blocks 1718. Next, the block transfers any desired properties from the inner blocks 1710 and the process ends 1722.

Figure 18:
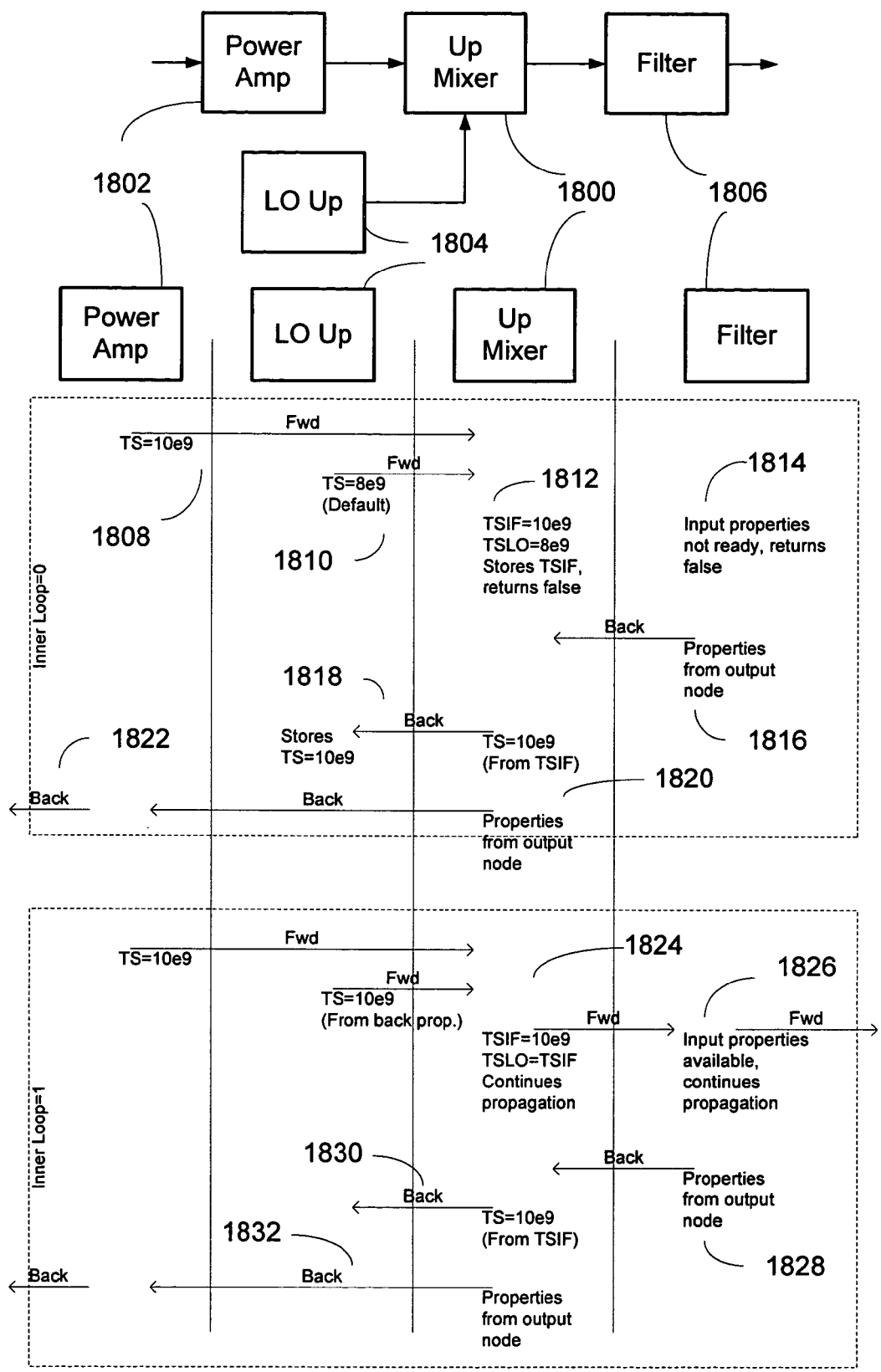
FIG. 18 is a block message flow diagram illustrating the case of a mixer that back propagates the time step from the IF input node (the main signal) to the local oscillator ("LO") input node (the carrier wave).

The inner loop allows blocks to negotiate with other blocks on the same data path. For example, FIG. 18 is a block message flow diagram illustrating the case of a mixer 1800 that back propagates the time step from the IF input node (the main signal) 1802 to the local oscillator ("LO") input node (the carrier wave) 1804.

Propagation would first proceed in the forward direction up to the mixer block 1800. When the mixer block 1800 is visited, the mixer block 1800 checks the time steps from the IF and LO input nodes, 1808 and 1810 respectively. If the time steps do not match, the mixer 1800 records the time step from the IF input node 1808, then returns false to indicate that forward propagation has not completed. In this example, the IF has a time step of 10e9 ns and the LO has a time step of 8e9 ns. Because the time steps are different, the time step of the IF is stored 1812, the input properties are not ready and the mixer block 1800 returns false. The blocks following the mixer will generally also return false since they will not have properties available because the mixer did not propagate any properties 1814.

The back propagation step is then performed 1816. When the mixer is visited, it back propagates to the LO input node the saved time step from the forward propagation 1818. The source 1802 at the start of the data path leading to the LO input 1804 of the mixer 1800 will be visited as part of the back propagation, and will detect a requested time step. This time step would differ from the time step back propagated by the mixer if there were intermediate blocks that generated a different number of samples than they consumed. Hence, the source block 1802 the stores this requested time step 1822.

The inner loop would then repeat because the first forward propagation did not complete. This time the source at the LO input data path propagates the time step that was requested during back propagation. Eventually the mixer is again visited and if the time steps from both the LO 1804 and IF input nodes 1802 match, the mixer continues propagation. The back propagation transmits the properties from the output node 1828 to both the LO 1830 and the IF 1832.

Limiting the number of times the inner loop is executed detects deadlock situations. The outer loop lets blocks request a repeat of the full propagation pass. Blocks that back propagate a specific value and wait for forward propagated values to match, such as a mixer or a transmitter, normally request at least one repetition of the propagation pass. This is to make sure properties have had a chance to be fully propagated throughout the network.

Because blocks determine what gets propagated, it is helpful to explain some default block behaviors. The following explanations have been found to be useful:

1. By default combine all properties from input/output nodes and propagate the set to all output/input nodes. If there are duplicate properties, use the property from the top-most node in the diagram, since that is typically the data signal.
2. Provide a means of specifying a time scale and a samples per symbol scale on each output/input node. The default behavior scales the time step and samples per symbol properties from the input/output node prior to propagating the values on the output/input node.
3. Verify the time step of all input nodes match. These default behaviors are easily overridden in individual blocks.

Figure 19:
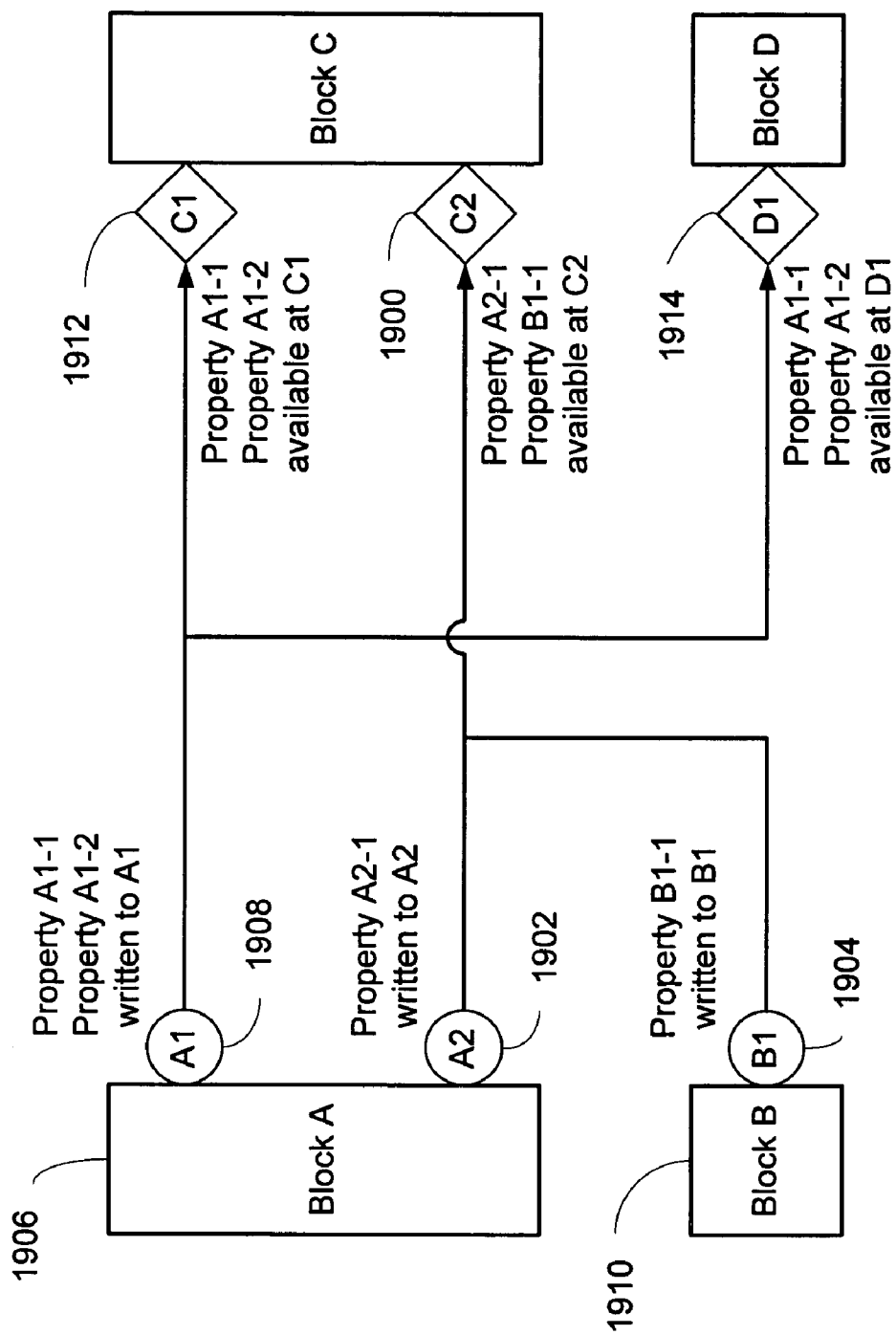
FIG. 19 is a block diagram illustrating the accessibility of properties.

The passing of properties from one block to another may be implemented in various ways. A block could write individual properties to a node. The node (sending node) would then pass those properties on to all the nodes connected in the direction of property flow (receiving nodes). The properties could be stored at either the sending or receiving nodes, or both. FIG. 19 illustrates a typical network topology while FIG. 20 illustrates the storage of properties at the receiving nodes given the network topology of FIG. 19.

FIG. 19 also illustrates the backward propagation direction since node C2 (1900) is connected to both nodes A2 (1902) and B1 (1904). Block A (1906) sends the properties "A1-1" and "A1-2" to node A1 (1908) and sends the property "A2-1" to node A2 (1902). Block B (1910) sends the property "B1-1" to node B1 (1904). Due to the connectivity of the nodes, properties "A1-1" and "A1-2" are propagated to nodes C1 (1912) and D1 (1914). Properties "A2-1" and "B1-1" are propagated to node C2 (1900).

Figure 20:
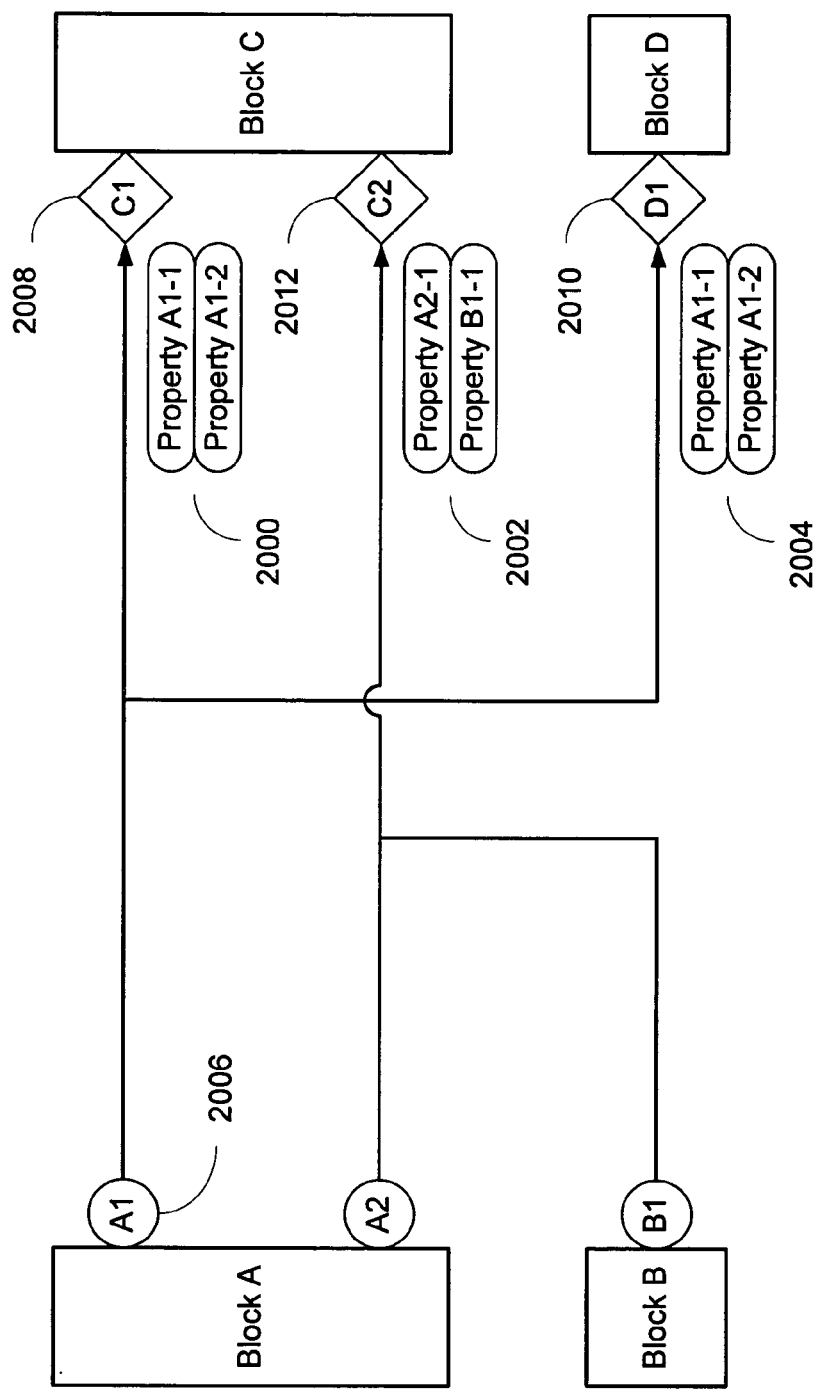
FIG. 20 is a block diagram illustrating storage locations of properties.

In FIG. 20, the rounded rectangles 2000, 2002 and 2004 are used to indicate the storage location of a property. The storage locations could be an independent object, or it could be a reference to a shared object. When property "A1-1" is written to node A1 (2006), the simulator stores the property at node C1 (2008). A copy of the property or a reference to the property at node C1 (2008) is also stored at node D1 (2010). The same holds for property "A1-2." For property "A2-1", a copy is stored at node C2 (2012). For property "B1-1", a copy is also stored at node C2 (2012).

Properties could also be passed through the use of an object holding a collection of the properties for a node. In this case a block could obtain the object from an input/output node, make modifications to the properties contained within it, and pass it on to an output/input node. The block, simulator, nodes and/or properties object itself would have to be smart enough to determine when a copy of the object should be made.

Figure 21:
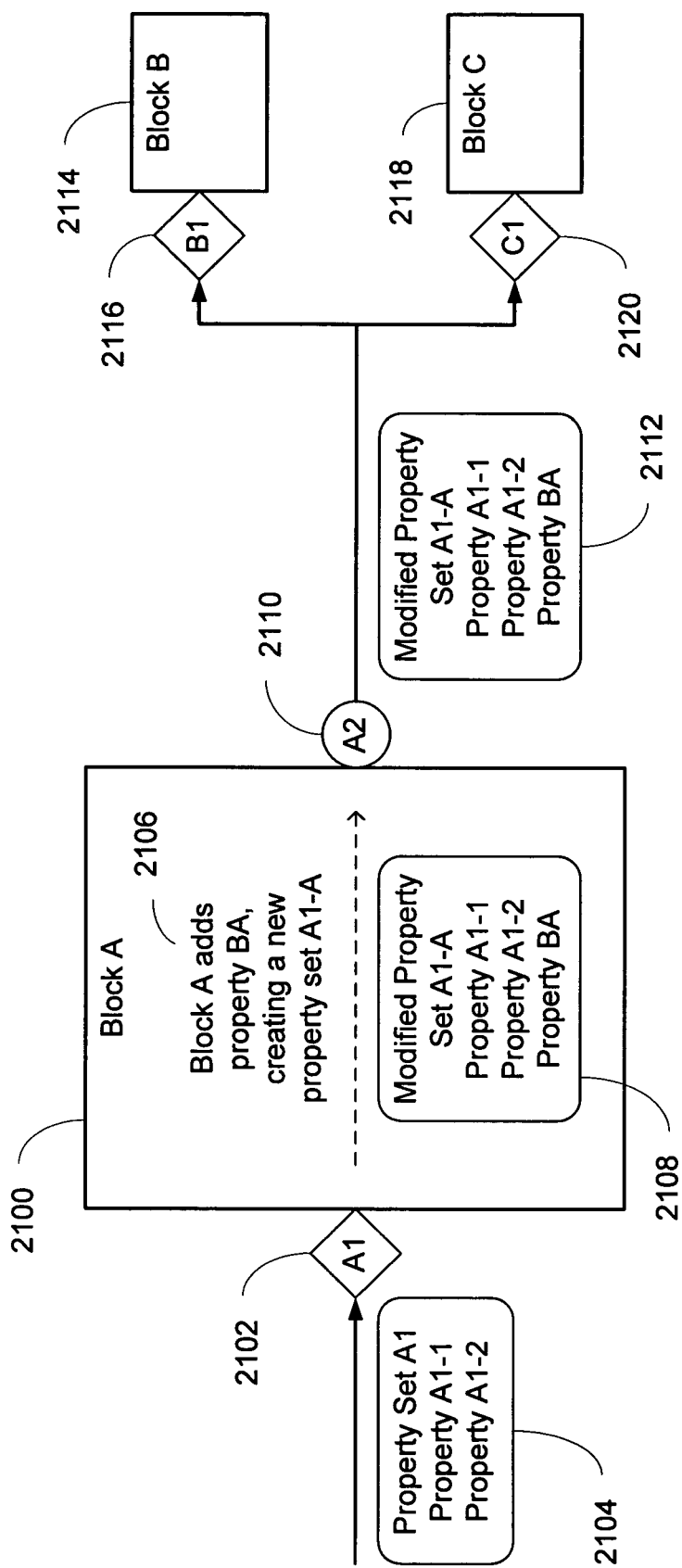
FIG. 21 is a block diagram illustrating self-determining copying of objects.

FIG. 21 illustrates this technique. Block A (2100) retrieves the set of properties from node A1 (2102) as a single object, property set A1 (2104). It then adds a new property, "BA" (2106) to the property set, resulting in a modified property set object A1-A (2108). Block A then propagates this property set to node A2 (2110) by passing the object directly to node A2 (2110). Node A2 (2110) stores this object (2112) that could physically be the same object as property set A1-A (2108). When block B (2114) requests the properties from its node B1 (2116), it receives the property set object A1-A (2108). When block C (2118) requests the properties from its node C1 (2120), it also receives the property set object A1-A (2108).

Figure 22:
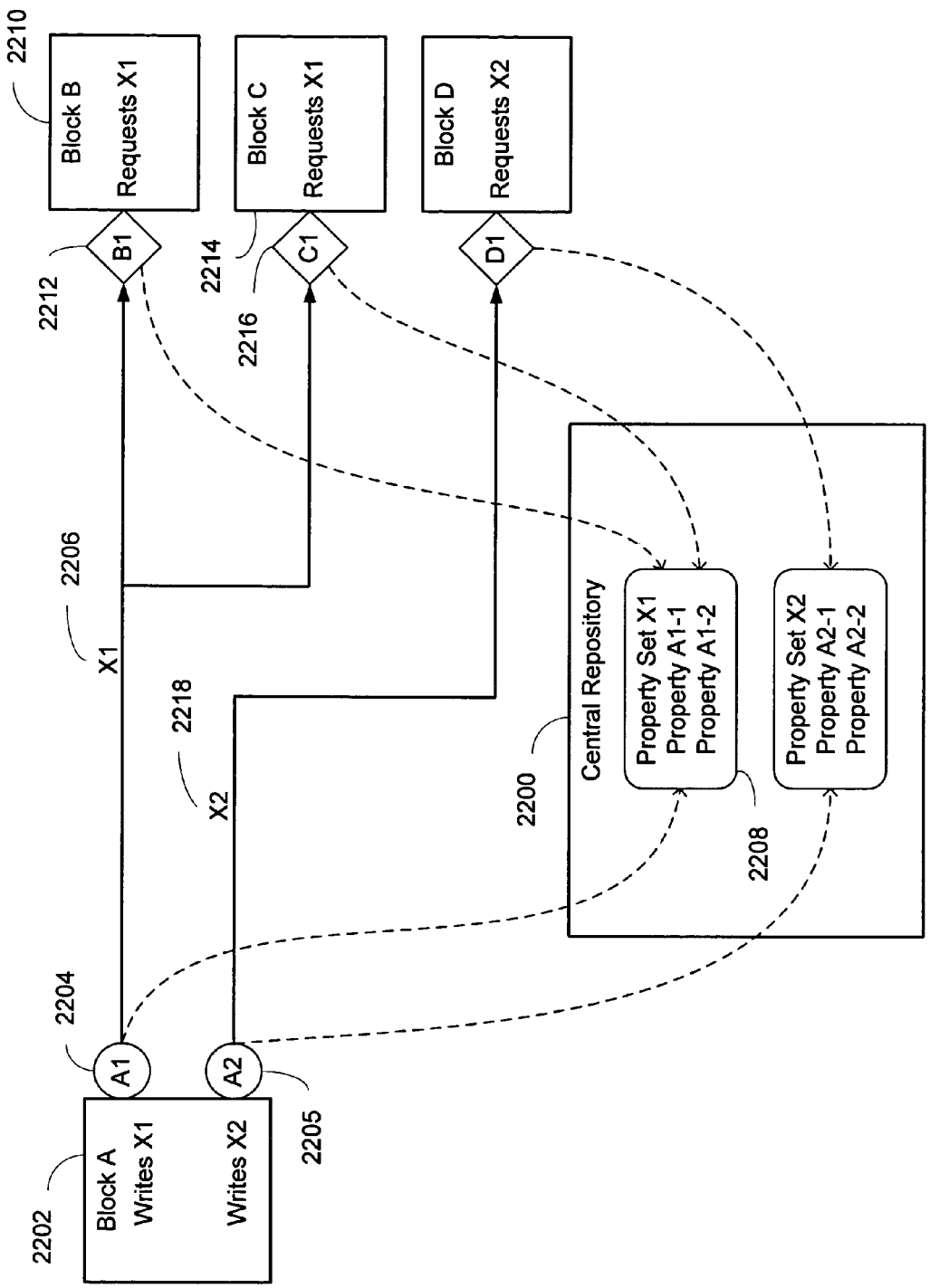
FIG. 22 is a block diagram illustrating the use of a central repository.

Another possible implementation is to use a central repository or database. An output node and all the input nodes connected to it would share a single, unique identifier for the forward propagation direction and another one for the reverse direction. A block would then use these identifiers along with the property specific identifier to access or store properties in the repository. FIG. 22 illustrates the use of a central repository.

All blocks have access to the central repository 2200. Block A (2202) has nodes A1 (2204) and A2 (2205). When block A (2202) writes properties to node A1 (2204), an entry is created in the repository using the unique identifier "X1"

(2206). The storage format in the repository can vary. For example, individual properties could be stored, or a single set of properties could be created and associated with the identifier "X1" (2208). When block B (2210) retrieves the properties available at node B1 (2212), it queries the central repository for the properties associated with the identifier "X1." When block C (2214) retrieves the properties available at node C1 (2216), it also queries the central repository for the properties associated with identifier "X1" (2206).

Other algorithms and node visitation schemes are possible with one concept being that all of the properties sent to a node are accessible from all nodes connected to that node in the direction of propagation. Alternative embodiments may provide for the isolation of various nodes where properties are not propagated to those isolated nodes.

Figure 23:
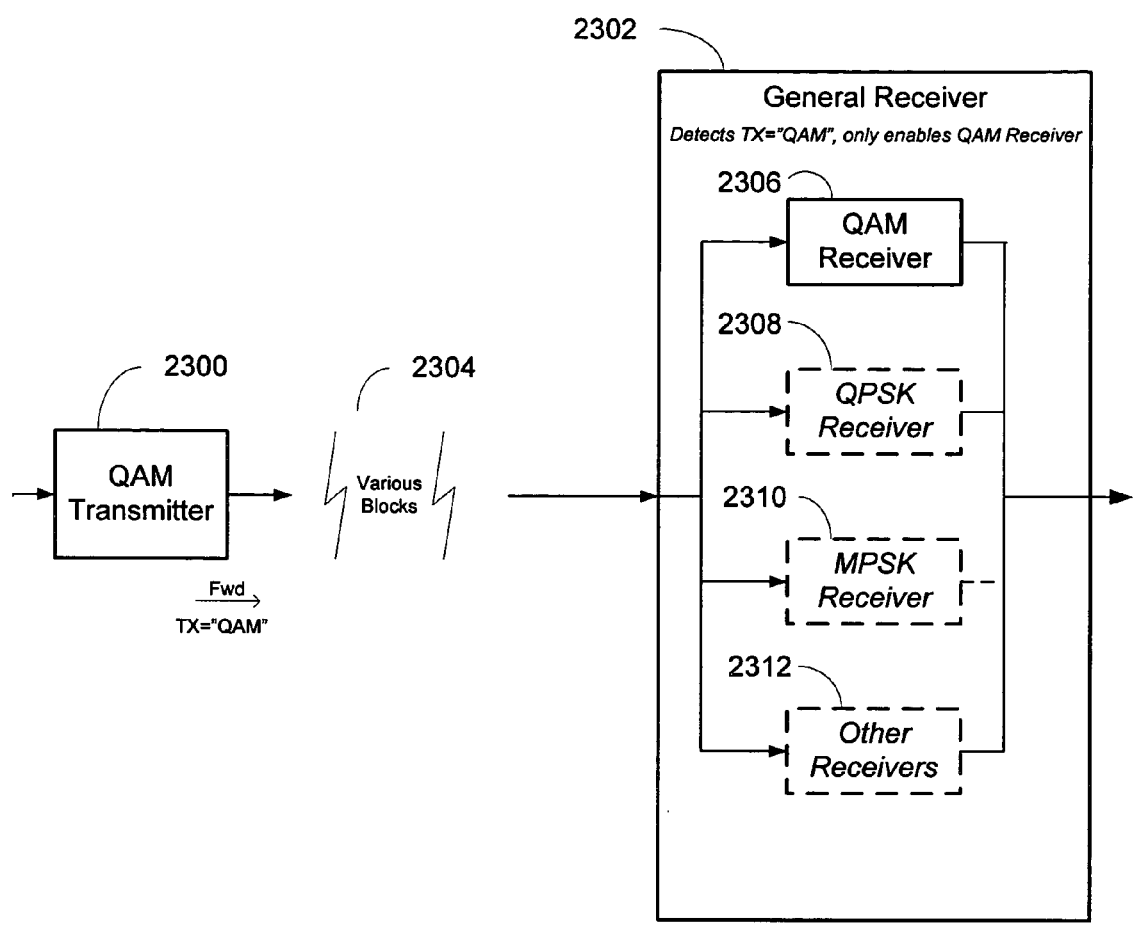
FIG. 23 is a block diagram illustrating a general receiver block that may be created that encapsulates several different types of receiver blocks for different modulation schemes.

The propagation of algorithm information may also be used by a general-purpose block that encapsulates a number of specialized blocks to simplify the task of selecting matching blocks. For example, FIG. 23 is a block diagram illustrating a general receiver block that may be created that encapsulates several different types of receiver blocks for different modulation schemes. By using the general receiver block, a user could try transmitter blocks with different modulations without having to make any changes to the receiver block.

In FIG. 23, a quadrature amplitude modulating ("QAM") transmitter 2300 is connected in a communication system. The system simulation engine may configure a general receiver 2302 across various blocks 2304 in the communication system. The general receiver 2302 detects that a QAM transmitter is present, and thus enables only the QAM receiver 2306. The QAM receiver 2306 is selected from a variety of receivers such as a quadrature phase-shift keying ("QPSK") receiver 2308, a M-ary-phase shift keying ("MPSK") receiver 2310 or any other receivers 2312 that are well known in the art.

Figure 24:
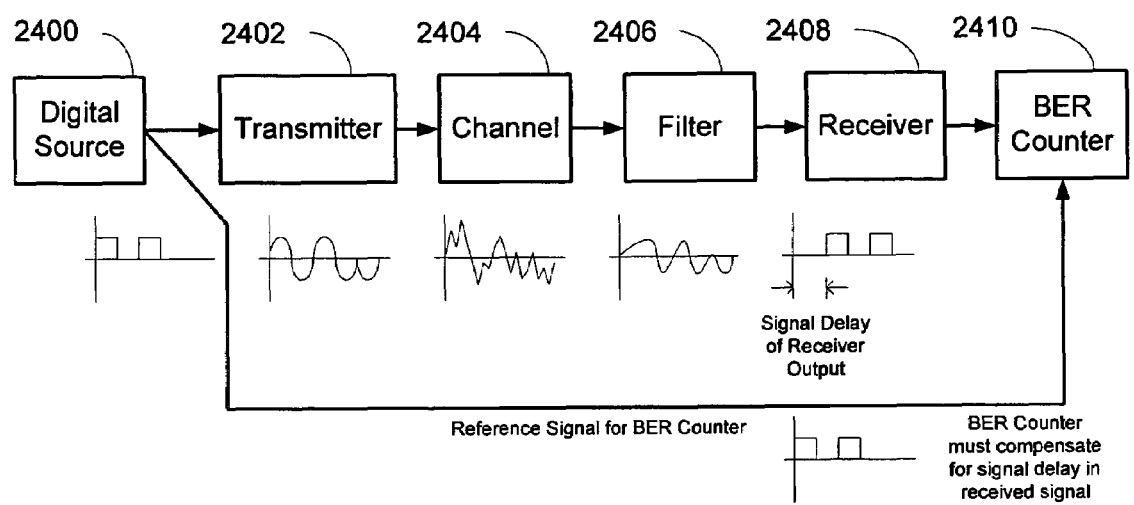
FIG. 24 is a block diagram illustrating the propagation of a signal delay.

General algorithm information may also be propagated that may be adjusted by other blocks and further propagated. FIG. 24 is a block diagram illustrating the propagation of a signal delay. A digital source 2400 is connected to a transmitter 2402. A signal is transmitted across the channel 2404 and filtered 2406. The filter 2406 may propagate a signal delay. In this example, a finite impulse response ("FIR") filter is shown. Because of the particular characteristic properties associated with FIR filters, a delay is introduced by the FIR filter in the input signal. Other blocks could be added between the transmitter 2402 and the receiver 2408 that may also introduce a signal delay. These blocks would add to the total propagated signal delay. The receiver block 2408 would check for a signal delay, and if present, add additional delay as necessary in order to align the input signal on a symbol period boundary. A bit error rate block 2410 might then use the signal delay to ignore the initial symbols received that are due to the signal delays introduced in the network in order to compare the symbols with the expected symbols.

Another example of the propagation of general algorithm information is the propagation of a center frequency for complex envelopes. In data flow and time based simulations, it is common to model a radio frequency ("RF") signal using the complex envelope of the signal. The complex envelope of a signal is equivalent to the RF signal shifted down to DC (zero frequency). Mathematically, the complex envelope:

$$\tilde{s}(t)=x(t)+jy(t)$$

is related to the RF signal by s(t) by:

$$s(t)=Re[\tilde{s}(t)\exp(j2\pi f_c t)]$$

where $f_c$ is the center frequency of the signal.

Figure 25:
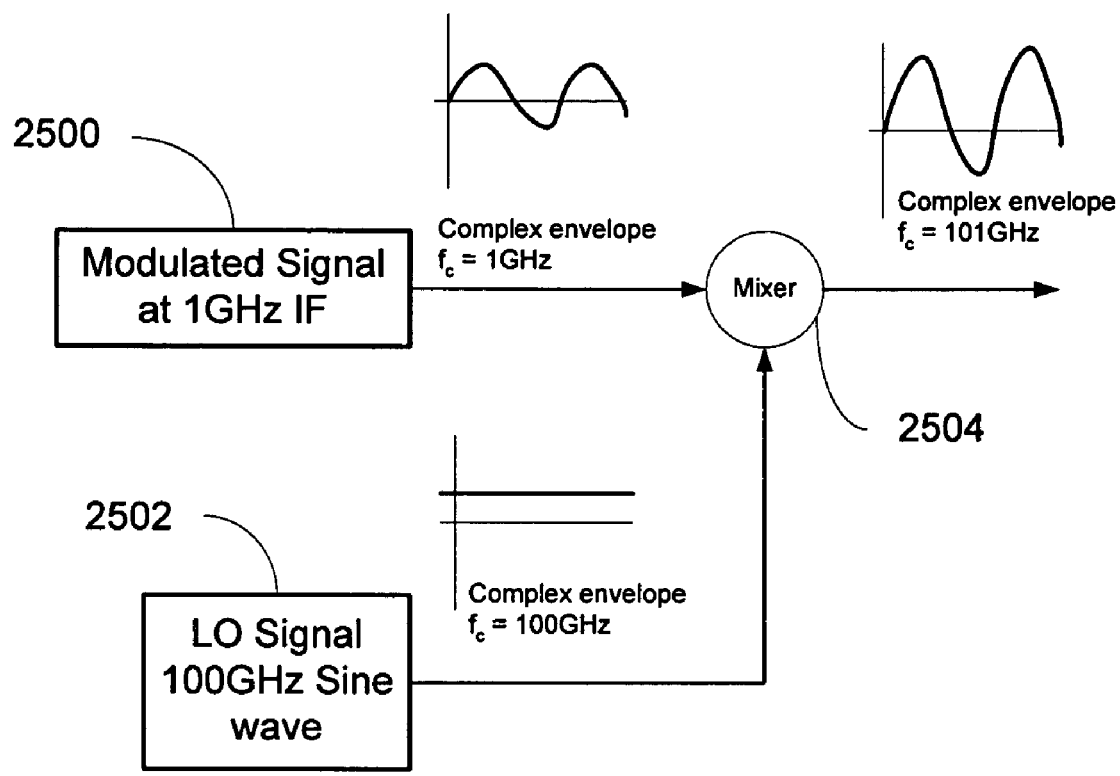
FIG. 25 is a block diagram illustrating the representation of a signal using the complex envelope.

FIG. 25 is a block diagram illustrating the representation of a signal using the complex envelope. The sampling frequency necessary to properly represent the signal is much smaller than the sampling frequency necessary to represent the RF signal. The modulated signal at 1 GHz (2500) is combined with a local oscillator ("LO") signal of 100 GHz (2502). By propagating the center frequency, blocks representing RF devices such as mixers or combiners 2504 can accommodate several different center frequencies on their input nodes and generate a complex envelope at an optimum center frequency on output. A multiplier block adds the center frequencies of all of its input nodes to determine the center frequency of its output, and multiplies the complex envelopes to obtain the output complex envelope.

The propagation mechanism can also be used to simplify the determination of the time steps of the various data sequences. In many cases, the output symbol rate of a transmitter is specified as part of the design requirements. Thus, the propagation mechanism may be used by a transmitter to pass the desired output symbol rate back to its input connections and that is then back-propagated ultimately to the source block. Along the way, the data rate may have been adjusted by other blocks such as a channel encoders or a symbol mapper. The source block can then utilize the requested data rate to specify the time step of its output, thus propagating this value in the forward direction through any intermediate blocks, and on to the transmitter and beyond. If this propagation is performed manually, the user would need to compensate for any blocks that change the time step of the data stream (channel encoders for example) in order to determine the data rates required to obtain the desired symbol output rate at the transmitter.

Figure 26:
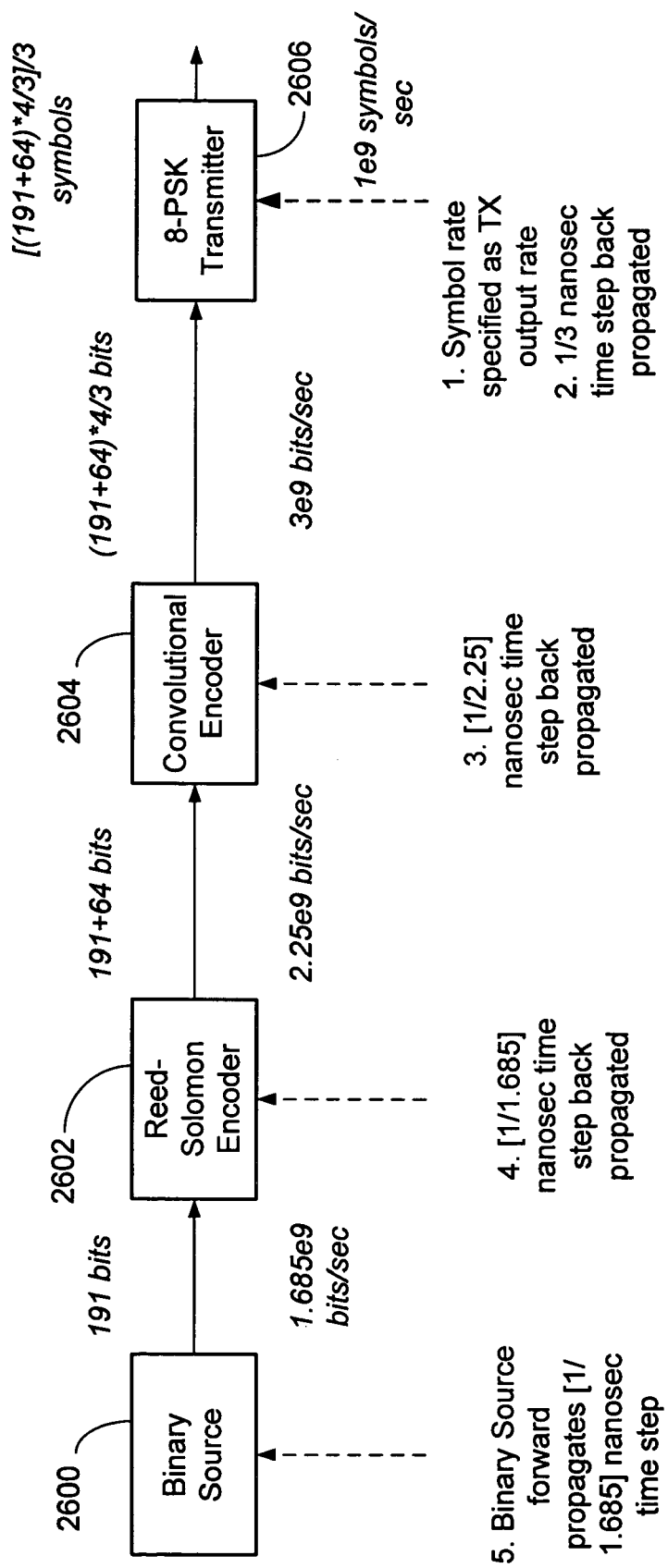
FIG. 26 illustrates the effects of such a propagation using a hypothetical communications standard.

FIG. 26 illustrates the effects of such a propagation using a hypothetical communications standard. This hypothetical communications standard may specify a binary source 2600 generating a block size of 191 bits. This signal is encoded with a (255,191) Reed-Solomon encoder 2602 producing a bit stream of 191 plus 64 bits of information. A ¾ rate convolutional encoder 2604 increases the bit stream to 191 plus 64 bits multiplied by ⁴⁄₃. The information from the convolutional encoder 2604 output is then fed into an 8-PSK transmitter 2606 which produces 1 symbol for every 3 bits input. The transmitter 2606 therefore produces 191 plus 64 bits multiplied by ⁴⁄₃ and divided by 3 symbols for each original block of 191 bits generated by the source 2600.

If a 1 GHz symbol rate at the output of the transmitter 2606 is desired, the transmitter back propagates a time step of ⅓ nanoseconds (1 bit output for each 3 bits of input). The convolutional encoder 2604 back propagates a time step of 1/2.25 ns (4 bits output for every 3 bits input). The Reed-Solomon encoder 2602 back propagates a time step of 1/1.685 ns (255 bits output for every 191 bits input). The binary source 2600 detects the back-propagated time step and forward propagates it as its data rate. Without the back propagation mechanism, the user would need to determine the various data rate changes by hand in order to determine the necessary data rate for the source block to generate the 1 GHz symbol rate at the output of the transmitter 2606.

Figure 27:
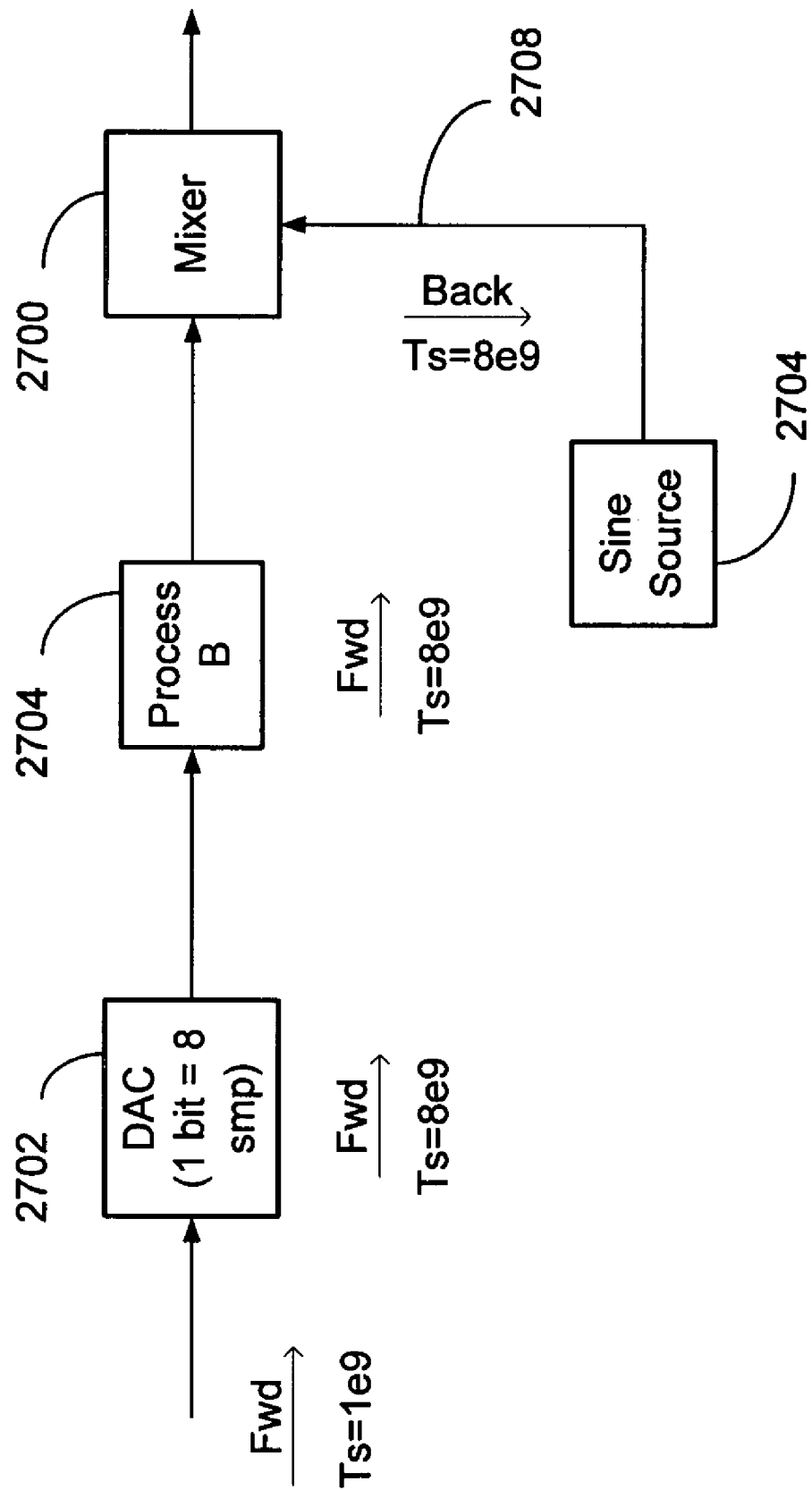
FIG. 27 illustrates such a back propagation scheme with more than one input.

The propagation mechanism may also be used by models with multiple input nodes to back propagate the time step from one input node to the other input nodes, thus eliminating the need to match the time steps at the source ends of the input nodes. FIG. 27 illustrates such a back propagation scheme with more than one input. A multiplier or a mixer block 2700 typically has a main input or signal, and a second input node 2704 that is used to modify the main signal. Normally the main signal is the signal of interest and is where the time step is specified. The second input signal 2708 might simply be a sine wave source. The block 2700 could retrieve the time step propagated into its main input node and back propagate the time step to the second input node, eliminating the need to specify a compatible time step at the sine wave source.

Figure 28:
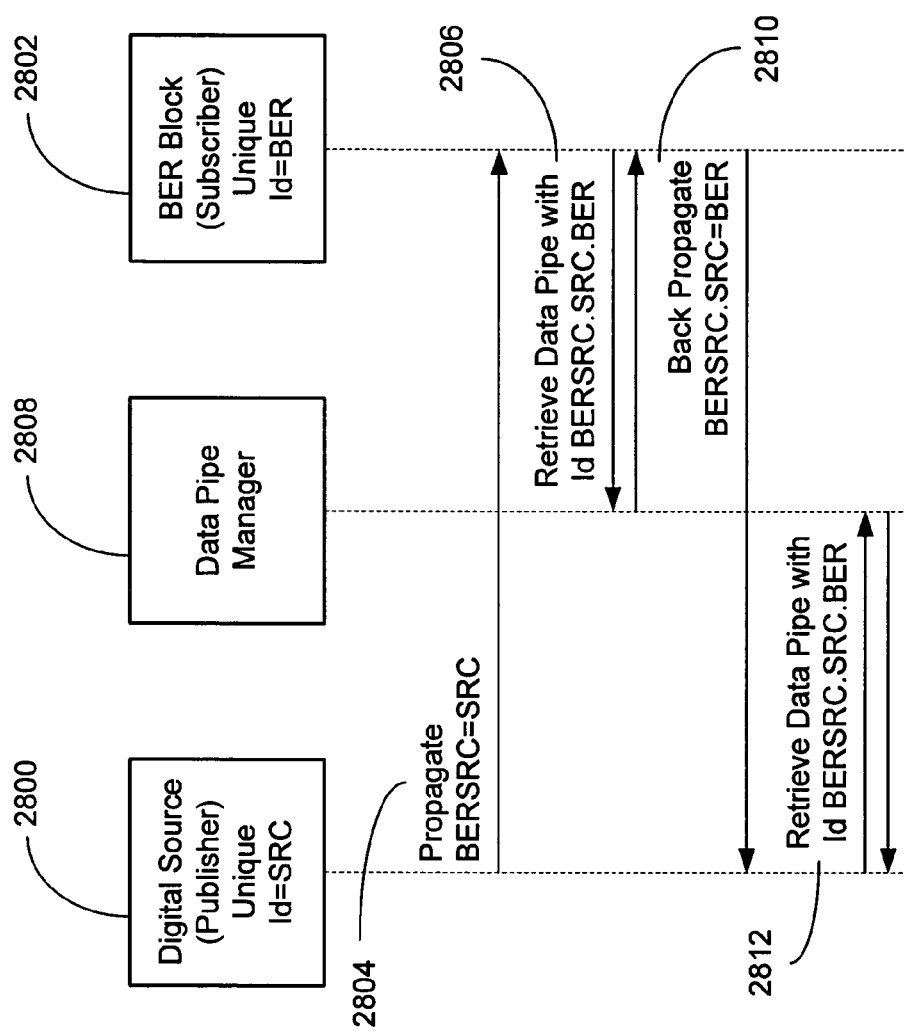
FIG. 28 illustrates a bit error rate (BER) measurement using a digital source that generates data that is passed through a communication system.

The propagation mechanism may also be used to establish alternate communication paths between blocks. For example, FIG. 28 illustrates a bit error rate (BER) measurement using a digital source 2800 generating data that is passed through a communication system. The received data must then be compared with the original data passed into the system in order to count bit errors. One mechanism for performing this task is to require the user to connect the digital source block's output to the BER block 2802 in order to provide the BER block with the reference data.

While this mechanism has flexibility in terms of adding new digital source algorithms, it has two distinct disadvantages. First, it requires an explicit action by the user. Second, it adds clutter to the design because the digital source block 2800 may be on one end of the diagram, while the output to the BER meter is at the opposite end of the diagram.

A second mechanism for obtaining the reference information is to generate a copy of the reference data within the BER block itself. The BER block 2802 may use properties propagated from the digital source 2800 to determine the exact configuration of the digital source 2800. The disadvantage of this method is that the BER block 2802 must be updated in order to add a new digital source algorithm.

A third mechanism may use the propagation scheme to establish an internal data path between the digital source block 2800 and the BER block 2802. The digital source block 2800 would pass a copy of the data it generates directly to the BER block 2802. Such a data path may be established using a publish-subscribe mechanism. Digital source blocks would propagate a unique identifier (such as the block's internal pointer) as the value of an agreed upon property (for example "BERSRC") 2804. A BER block 2802 would look for this property, and upon receiving it, would request a named data pipe 2806 from a central data pipe manager 2808 with a name composed of the combination of the digital source's identifier and a unique identifier for the BER block 2802.

The BER block 2802 may also back propagate its identifier as the value of the original property name plus the source's unique identifier 2810. If the source's unique identifier were "ABC" and the BER block's unique identifier were "DEF," the property would be "BERSRC.ABC" with value "DEF." The digital source 2800, upon receiving a property composed of the original property name plus its unique identifier, would then request the same data pipe 2812 as the BER block 2802 from the central data pipe manager 2808. The digital source 2800 would then, as the simulation proceeds, pass a copy of the data it generates to the data pipe 2808.

The BER block 2802 would retrieve the reference data from the data pipe 2808 as it receives data. The back propagation of the BER block's unique identifier 2810 allows a digital source 2800 to support more than one BER block 2802 because each identifier yields a unique data pipe 2808. The digital source 2800 simply maintains a list of all the requested data pipes 2808 and copies its data to each one.

Impedance Mismatch

For example illustration purposes, existing data flow and discrete time based simulation programs assume ideal termination conditions between blocks in the various figures. Often, the input and output impedance of each block are assumed to be terminated perfectly under ideal conditions with some assumed value provided representing impedance. However, this assumption can lead to very significant modeling errors in the simulated results. In general, termination impedances are complex frequency dependent functions that result in frequency dependent mismatch losses between the blocks.

Typically, most systems blocks are assumed to be unilateral, ideally-matched blocks. For a two-port block (one input, one output), the frequency domain scattering parameter (S-parameter) matrix is assumed to be referenced to the global system impedance (the inverse of an admittance) $Z_0$ by:

$$S = \begin{bmatrix} 0 & 0 \\ S21 & 0 \end{bmatrix}$$

Assuming S11 and S22 to be zero means that there is no impedance mismatch at the input or output if the nodes are loaded with the system impedance. This is always the case in an ideal system. However, in general, such an impedance mismatch is present that causes a voltage standing wave at the input and/or output nodes. This standing wave can cause the voltage at that node to be drastically different than if the mismatch were ignored.

Figure 29:
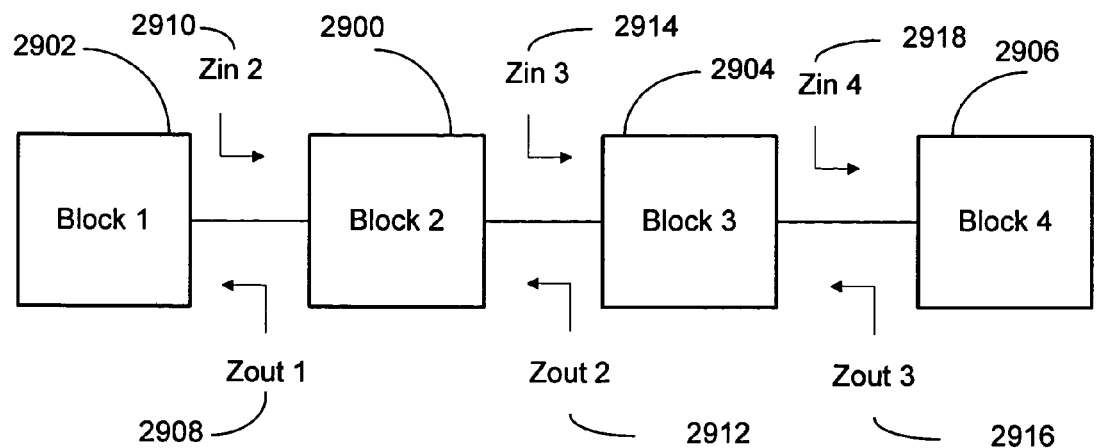
FIG. 29 is a block diagram illustrating impedance mismatch blocks in a simple three block scheme.

In its simplest form, the invention may be illustrated in FIG. 29 where the impedances looking into each block are determined in one propagation pass. Note that either impedances or admittances may be used to calculate the mismatches. Block 2 (2900) is connected to both Block 1 (2902) and Block 3 (2904). Block 3 (2904) is also connected to Block 4 (2906). Block 1 (2902) has impedance Zout1 (2908). Block 2 (2900) has impedances Zin2 (2910) and Zout2 (2912). Block 3 (2904) has impedances Zin3 (2914) and Zout3 (2916). Block 4 has impedance Zin4 (2918).

The impedance Zin2 (2910) looking into the input of Block 2, will in general, be dependent on the impedance Zin3 (2914) looking into Block 3 (2904). Likewise, the impedance Zin3 (2914) is dependent on the impedance Zin4 (2918). The impedance Zout2 (2912) looking into the output of Block 2 (2900) will depend on the impedance Zout1 (2908) looking into the output of Block 1 (2902) and the impedance Zout3 (2916) looking into the output of Block 3 (2904) will depend on the impedance Zout2 (2912). In other words, Zin2 (2910) is a function of Zin3 (2914).

The forward property propagation is performed first starting with the source blocks, followed by backward property propagation that start with the sink blocks. Since forward property propagation is done first, the frequency-dependent impedance looking into the output node of a source block identified as Block 1 (2902) is calculated first. Zout1 (2908) is forward-propagated to Block 2 (2900). Block 2 uses this propagated impedance and it's own Z-parameters to calculate and propagate Zout2 (2912). This is repeated down the chain of blocks until a sink block is encountered Block 4 in this example. Backward property propagation is performed next. The impedance looking into the input node of a load or source Block 4 (2906) is calculated as Zin4 (2918), the impedance looking towards the load for Block 4 (2906). Zin4 (2918) is back-propagated to Block 3 (2904). Block 3

(2904) uses this propagated impedance and it's own Z-parameters to calculate Zin3 (2914). This is repeated up the chain until the original source block, Block 1 (2902) is encountered.

In the example shown in FIG. 29, a single propagation pass (one forward, one backward) is all that is required for all of the blocks to calculate and propagate the impedance seen looking into all of it's nodes. In general, however, multiple propagation passes may be necessary for a block to be able to calculate the impedances that it is to propagate.

During the second propagation pass, three things happen: (1) each block calculates it's own Z-parameter matrix at the global mismatch frequencies, (2) each block calculates it's own S-parameter matrix at it's own operating frequencies (referred to as the block's local frequencies), and (3) if possible, each block calculates the frequency-dependent, complex impedances seen looking into all of its nodes at the global mismatch frequencies, and propagates this information (in the form a vector of values) to all connected blocks. If a block does not have enough information to do so, it requests another property propagation pass from the simulator. If a block never receives a propagated impedance vector at a node, the default system impedance is assumed at all frequencies.

Note that each block can calculate it's Z-parameters in different ways. Some blocks can actually connect to a linear simulator and use the Z-parameters from an actual circuit or a measured data file. Other blocks may also want to internally reference a table of stored values to get their Z-parameters.

Figure 30:
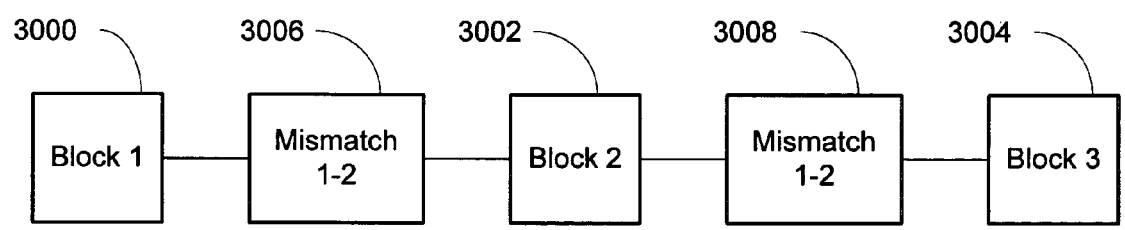
FIG. 30 is a block diagram illustrating impedance mismatch blocks in a simple three block scheme with additional blocks representing the impedance mismatch between boxes.

A more realistic model is illustrated in FIG. 30. In FIG. 30, Block 1 (3000) is connected to Block 2 (3002), which is in turn connected to Block 3 (3004). Separating Block 1 (3000) and Block 2 (3002) is Impedance Mismatch Block 1-2 (3006). Separating Block 2 (3002) and Block 3 (3004) is Impedance Mismatch Block 2-3 (3008). The signal alteration due to the impedance mismatches between two blocks is represented as a mismatch block. The transfer function for each mismatch block will be a frequency dependent complex function. For a discrete time or a data flow simulation, the frequency dependent transfer function will be modeled in the time domain using digital signal processing techniques such as a finite infinite response ("FIR") filter that computes its coefficients using the complex frequency dependent mismatch loss as the frequency domain transfer function for the FIR filter. Alternatively, an infinite impulse response ("IIR") filter or use of other digital signal processing ("DSP") techniques may be used for these blocks. In an actual implementation, the mismatch blocks may not need to be added as shown in FIG. 30, but may automatically be included within an adjacent block. For example, the Mismatch Block 1-2 (3006) may be included within Block 2 (3002).

An important aspect of this invention is how the frequency domain transfer function for the mismatch blocks are obtained. To compute the frequency domain transfer function of Mismatch Block 1-2 (3002) illustrated in FIG. 30, the frequency dependent impedances shown as Zin2 (2908) and Zout1 (2906) of FIG. 29 are needed. Assume the use of the notation Zin2(f) and Zout1(f) indicates that the quantities are functions of the frequency (f).

If the frequency domain transfer function of Mismatch Block 1-2 (3006) is represented as MM12(f), then the function G(Z1,Z2) may be derived such that:

$$MM12(f)=G(Zout1(f),Zin2(f))$$

If the frequency response of each of the blocks in FIG. 29 is represented as B1(f) for Block 1 (2900), and B2(f) for Block 2 (2902), etc., then the overall transfer function for the connected blocks of FIG. 29 may be represented as:

$$H(f)=B1(f)*G(Zout1(f),Zin2(f))*B2(f)*G(Zout2(f),Zin3(f))*B3(f)$$

Also, the derived function G(Z1,Z2) may be included. If the mismatch effects are ignored, then the transfer function may be represented as:

$$H(f)=B1(f)*B2(f)*B3(f)$$

This simpler transfer function ignoring the mismatch is what is typically simulated in system simulators that operate using discrete time data. This invention provides a specific methodology for how the frequency dependent impedances are obtained. In the previous example, it was shown that if values for Zout1(f) and Zin2(f) are known, then the frequency domain transfer function MM12(f) of the mismatch effect may be computed. The problem is, that in the example, Zin2(f) is actually a function of Zin3(f), so the block cannot determine Zin2(f) without first obtaining a value for Zin3(f) from the adjacent connected block.

Also, to model the mismatch as part of Block 2 (3002), would require that Block 2 (3002) obtain both Zin3(f) and Zout1(f) from the block located before and after the block of interest. The example above is for a simple case of cascaded blocks that form a chain. This invention can apply to extendable blocks arranged in a complex scheme with arbitrary connections, rather than a simple representation of various blocks that are connected together in a chain with only two connection points.

The property propagation scheme previously discussed is the mechanism that is used to enable Block 2 (3002) to obtain the values of Zin3(f) and Zout1(f) that Block 2 (3002) needs to compute the frequency dependent mismatch loss between Block 1 (3000) and Block 2 (3002). The frequency dependent impedances are propagated as vector valued properties from one block to the next. The vector of values represents the values of the impedances at discrete frequency points. This vector of impedances can be thought of as a discretely sampled representation of the frequency dependent impedance. The actual values of frequency that are chosen for the sampling must be chosen carefully in order to obtain an accurate modeling of the mismatch. If all the connected blocks use the same set of frequency samples for all the propagated impedances, then the implementation of the mismatch block will be simpler, but it is important to note that this is not an absolute requirement. If the sampling frequencies are not the same for impedances of different blocks, then interpolation and/or extrapolation can be used to obtain approximate values of the impedances at a common set of frequency sample points.

At this point, it should also be mentioned that the sampled discrete time representation of the signals that are being simulated can be sampled versions of the actual waveform, or they can be sampled versions of the complex envelope of the waveform. The most common case is typically when the signal is the discretely sampled complex envelope of the waveform because this is the representation that is most commonly used for simulating modulated signals.

The example below illustrates the frequency response of a modulated signal. The lower diagram in FIG. 31 illustrates the frequency response of the same signal that has been shifted down to dc (zero frequency). The signal shifted to dc is called the baseband version of the signal, and the complex envelope is the time representation of the baseband signal.

The sampled complex envelope is then just the baseband signal discretely sampled in the time domain. The reason that this is important is that the sampling frequencies that are used for the sampled impedances typically should be centered around the carrier frequency ($f_c$) as illustrated in FIG. 31. The mismatch frequency response can be computed from the real frequency points sampled around the carrier frequency. After the mismatch transfer function is computed, it is shifted down to dc (baseband) and modeled as a complex frequency dependent transfer function at baseband. The block itself would typically be implemented as an FIR filter, although other DSP techniques may be used.

Another possible implementation may use an IIR filter to model the frequency domain transfer function. For the FIR filter implementation, the frequency response of the mismatch loss (shifted to baseband if it is a complex envelope signal) would be used to automatically compute the coefficients of the FIR filter. The number of taps used in the implementation of the FIR filter can be automatically adjusted to provide the best efficiency for the desired accuracy.

Another possible implementation may include using a fixed number of taps for all the blocks. This could be user configurable. If the frequency response of the mismatch varies significantly over the bandwidth of the signal, then more taps will be required to make the FIR accurately model the mismatch loss.

There are several options for how the mismatch effects are included. These options are illustrated below. FIG. 32 illustrates one of the models 3200 that locates the Mismatch Block 3202 within the Model Block 3204 as a Mismatch Block positioned before the Model Block 3202. Another option 3206 is to locate the Mismatch Block 3208 after the Model Block 3206.

FIG. 33 illustrates an alternative option where the Mismatch Block is not combined with the model and a separate block is positioned for the mismatch. This option may require the user to manually add the Mismatch Block.

Thus far, it has been assumed that the mismatch loss is modeled as a block before the model block as shown in option 3200. If the mismatch is modeled as the first block 3202, then there will be a Mismatch Block 3204 for each input. If the Mismatch Block is modeled at the output, then there will be a Mismatch Block for each output.

General Topology

The previous examples illustrated in FIGS. 29-33 have focused on two port blocks that are connected together in a chain. Although this is useful, it is not general enough for all the situations where modeling the mismatch effects is desirable. The following examples outline how this technique can be extended to model systems of more general topology. The first example shown below is for a block with a single input and multiple outputs. Arrows are shown on the interconnections between the blocks to indicate if the connection is an input or an output. The mismatch effects are shown as blocks within the blocks (modeled as a block before the model).

FIG. 34 shows an example of an example where a block in the chain has more than one output node. When this occurs, multiple propagation passes may be needed to obtain the various impedance values. Specifically, FIG. 34 illustrates how the blocks obtain all the required impedance values that are needed to determine the mismatch blocks shown as MMA through MMC. Both backward and forward property propagation is desired to allow the blocks to determine the impedances. The forward and backward property propagation may be accomplished in an iterative scheme, switching back and forth between forward and backward property propagation. The algorithm for this is described above in this invention.

In FIG. 34, assume that Z1L (3400), Z2R (3402) and Z3R (3404) are known quantities (the known quantities are shown with bold lines). Initially, Block A (3406) does not know Z1R (3408), Z2L (3410) or Z3L (3412). By property propagation, Block A (3406) can obtain Z1L (3408), Z3R (3404) and Z2R (3402). Also, Block B (3414) will initially only know the value for Z2R (3402) and Block C (3416) will only know the value of Z3R (3404). Once Block A (3406) knows the values of Z2R (3402) and Z3R (3404), then the simulator has enough information to compute ZIR (3408). Block A (3406) computes the value of Z1R (3408) and then back-propagates the ZIR (3408) value at Block A's (3406) input node. Block A (3406) can compute Z2L (3410) with knowledge of the values of Z3R (3404) and Z1L (3400). Z3L (3412) can be computed from knowledge of Z2R (3402) and Z1L (3400). Block A (3406) then propagates Z2L (3410) to Block B (3414) and Z3L (3412) to Block C (3416). Now, Block A (3406) knows the values of Z1L (3408) and ZIR (3408), so it can compute MMA (3418) and Block B (3414) knows Z2L (3410) and Z2R (3402), so it can compute MMB (3420), etc.

Figure 35:
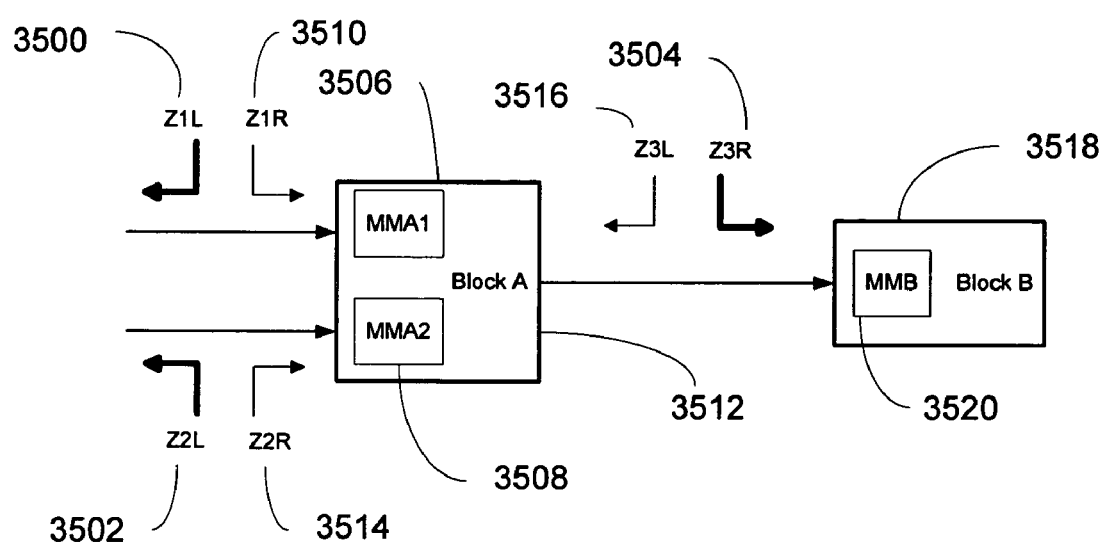
FIG. 35 is a block diagram illustrating the calculation of impedances.

FIG. 35 illustrates another example for a system where a block has multiple inputs and a single output. With known impedance values shown with bold arrows for impedance Z1L (3500), Z2L (3502), and Z3R (3504), the mismatch blocks may be computed at each of the inputs MMA1 (3506) and MMA2 (3508). The block MMA1 (3506) can be computed from Z1L (3500) and Z1R (3510). ZIR (3510) can be computed by Block A (3512) once Block A (3512) knows Z2L (3502) and Z3R (3504). MMA2 (3508) is found in a similar way. Also, once Block A (3512) knows the values for Z1L (3500), Z2L (3502) and Z3R (3504), then it can compute and propagate Z1R (3510), Z2R (3514) and Z3L (3516) which may be needed by adjacent blocks that need to compute mismatch blocks. For example, once Z3L (3516) is propagated to Block B (3518), then Block B (3518) has enough information to compute MMB (3520). Multiple input and multiple output systems are very similar and can be shown in a similar fashion.

Figure 36:
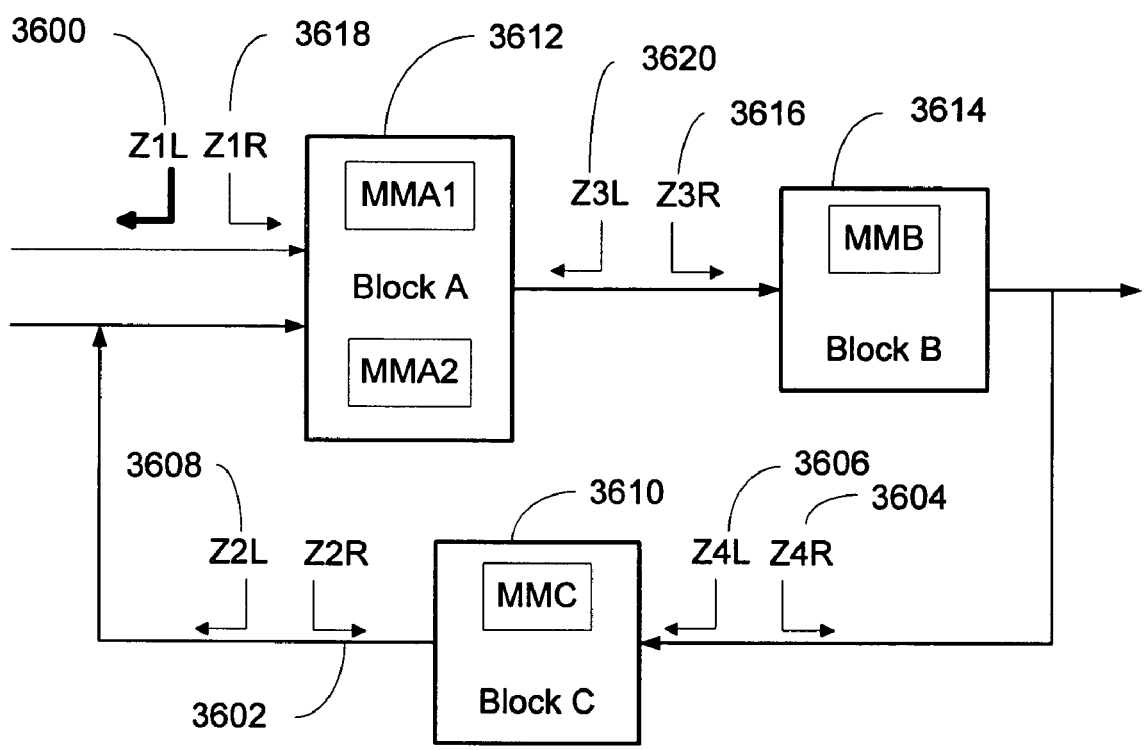
FIG. 36 is a block diagram illustrating the calculation of impedances.

A more complicated example that may require multiple property propagation passes is a feedback loop. Feedback loops can also be handled as long as certain assumptions are satisfied; for the impedance mismatch feature to work for feedback loops, at least one of the blocks in the loop must be unilateral (for a two port block, this means that S21=0). FIG. 36 illustrates the handling of impedance mismatch blocks in feedback loops. In this example, it will be assumed that only Z1L (3600) is a known value. If one of the blocks in the loop can be considered unilateral, then all the blocks in the loop will be able to compute their mismatch blocks using property propagation.

A block is unilateral if its input impedance does not depend on its termination impedance, or if it's output impedance does not depend on its source impedance. For example, if Z2R (3602) is independent of Z4R (3604), or Z4L (3606) is independent of Z2L (3608), then Block C (3610) is unilateral. In practice, it will usually be reasonable to assume one of the blocks in the loop is unilateral. As an example, if Block C (3610) is unilateral, then Block C (3610) can compute Z2R (3602) without having to know Z4R (3604). Block C (3610) can then propagate Z2R (3602) to Block A (3612). Likewise, Block C (3610) can propagate Z4L (3606) to Block B (3614), but because Block C (3610) is unilateral, it does not need to know the value of Z2L (3608) in order to compute Z4L (3606). At this point, Block B (3614) can compute Z3R (3616) from knowledge of Z4L (3606). Next, Block A (3212) can compute Z1R (3618), Z2L (3208) and Z3L (3620) from knowledge of Z1L (3200), Z3R (3616) and Z2R (3602). Once all the impedances are known, each block can compute its mismatch blocks.

The example of FIG. 36 calculates the impedances from three property propagation passes. It is assumed that Block C (3610) is a unilateral block that is not ideally matched (S11, S21, and S22 are not necessarily equal to zero, but S21 is always assumed to be zero). During the first forward propagation pass, Z1L (3600) is the only impedance that can be calculated. During the first backward propagation pass, Z4L (3606), Z3R (3616), and Z2L (3608) can be calculated. During the second forward propagation pass, only Z2R (3602) can be calculated. Z1R (3618) can be calculated during the second backward propagation pass. Finally, on the third propagation pass Z3L (3620) is calculated Certain system blocks may have the ability to take impedance mismatches at their nodes into account. With these blocks in a system diagram, the impedance mismatches may be accounted by enabling the feature in the system options. The two main mechanisms used to implement the impedance mismatch feature are by property propagation and finite impulse response (FIR) filtering.

When calculating the global mismatch frequencies during the first propagation pass, each block in the system diagram is visited to allow the block to report their center and sampling frequencies to the simulator. From this information, the simulator calculates the block's minimum and maximum operating frequencies. The simulator stores each of these values. Each time a block reports, the simulator checks to see if the current calculated minimum operating frequency is less than the minimum currently being stored. If so, the minimum operating frequency is updated with the new value. The same thing happens with the maximum operating frequency if the current calculated maximum frequency is greater than the maximum currently stored. After all blocks have reported, the simulator has knowledge of the minimum and maximum operating frequencies being used in the system diagram. These frequencies define a range of frequencies that will be used for calculating the frequency-dependent impedance mismatches for all of the nodes in the system. The minimum and maximum operating frequencies are respectively:

$$f_{op,min} = f_{c,min} - f_{s,min}/2$$

$$f_{op,max} = f_{c,max} + f_{s,max}/2$$

where $f_{op}$ is the operating frequency, $f_c$ is the center frequency and $f_s$ is the sampling frequency. Typically, the simulator stores these values for later recall.

A discrete set of frequencies is then generated with a range of resolution having at least the minimum frequency resolution. The frequency resolution may be more fine tuned so that the resolution is greater than that typically set by the user. For example, if the user sets a resolution value that is greater than the overall frequency range, a default minimum resolution value may be used instead. This set of frequencies may be referred to as the "global mismatch frequencies" for the system diagram and used by all Finite Infinite Response (FIR) filters that perform the mismatch correction.

Calculating the Impedance Mismatch Corrections

Once all of the impedances are propagated, each block can calculate the correction(s) it needs to apply to the input signal(s). Like the propagated impedances, the complex, frequency-dependent correction terms are calculated in the frequency domain. FIR filters are used to convert the correction to the time domain. Since each block may operate at different center and sampling frequencies than the global mismatch frequencies, interpolation is performed on the correction terms at the block's local operating frequencies before FIR filtering. The frequency resolution used for the local operating frequencies is generally determined by a parameter of the block.

Figure 37:
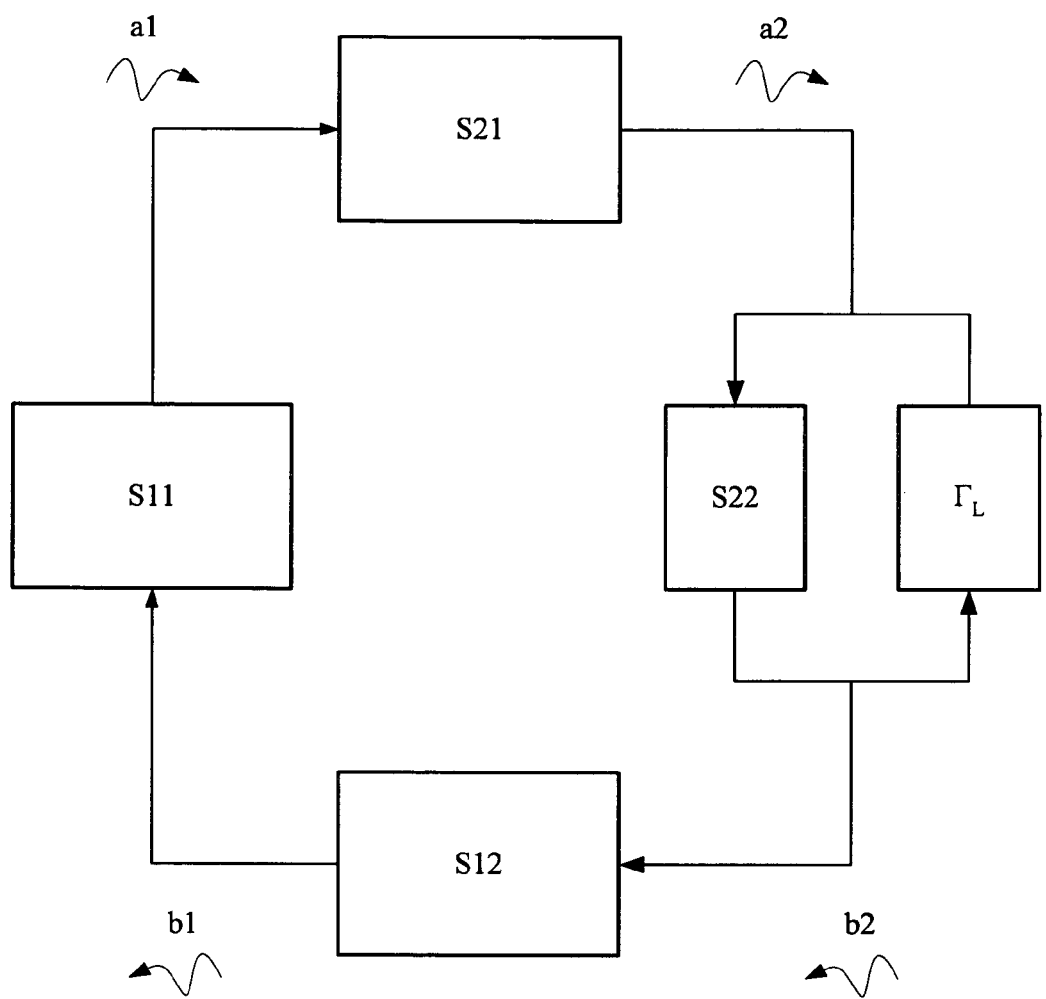
FIG. 37 is a block diagram illustrating the signal flow path for a two port block.

Signal flow graphs will be used to illustrate the necessary corrections that must be applied to the signal due to the impedance mismatches. FIG. 37 illustrates a simple signal flow diagram for two-port system block. Since all of the S-parameters for an ideally-matched, unilateral block are zero except for S21, the voltage seen at the output node is simply S21.

For mismatch-enabled blocks, all S-parameters are taken into account. Using Mason's Rule (which can be found in most elementary control systems textbooks and some microwave textbooks), the voltage at the output is the ratio of the b2 voltage wave to the a1 voltage wave and is found to be:

$$\text{Block Correction} = \frac{b2}{a1} = \frac{S21}{1.0 - S22 \cdot \Gamma_L}$$

Where $\Gamma_L$ is the reflection coefficient seen looking out from the output node.

The a1 voltage wave is normalized to 1.0. Therefore, a correction of $1.0/(1.0-S22*\Gamma_L)$ should be applied to the original S21 term. This is the altered signal that is passed to the following block(s). The correction is applied to the original S21 term using an FIR filter whose frequency response is set to the values calculated in the Block Correction Equation. The block performs this filtering internally and is transparent to the user. Note, the filtering could also have been done using an external block.

Note that the correction applied to the signal to be passed to the following block(s) is different than the correction necessary for a test point sensing the voltage at the output node. This voltage is found by adding the a2 and b2 voltage waves (again, using Mason's Rule):

$$\text{Testpoint Correction} = a2 + b2 = \frac{S21 \cdot (1.0 + \Gamma_L)}{1.0 - S22 \cdot \Gamma_L}$$

Note that the correction required for a test point at the output node is simply the first correction multiplied by the term $1.0+\Gamma_L$. Since this term must be applied by the test point, the block must propagate a test point voltage correction property that is to be received by the test point connected to it's output node. This requires yet another property propagation pass to propagate this information. This propagation pass is in addition to the propagation passes required to calculate the global mismatch frequencies and to propagate the impedances.

Any test points that receive a test point voltage correction property during property propagation must alter it's sensed voltage by applying the correction using another FIR filter whose frequency response is equal to the $1.0+\Gamma_L$ terms (it should be noted that this correction is not limited only to test points—other measurement devices, such as meters and signal analyzers, also have the ability to apply this correction.).

For blocks that have more than two nodes (e.g. two-input/one-output, one-input/two-output, etc.), termed an n-port, an FIR filter is necessary for each input/output node combination. The correction terms for each input/output node combination are calculated by reducing the n-port to a two-port. All nodes except for the input node and output node involved are loaded with the impedances seen looking out from those nodes. The resulting Z-parameters are then converted to S-parameters, and the above equations are used to calculate the correction terms. This must be done for each input-output node combination. If necessary, superposition is used to obtain the total voltage at an output node (an example of where this would be necessary is a block with two inputs and one output). To use superposition, the response of the block should be assumed to be linear. Care should be taken to make certain assumptions when applying corrections to blocks with non-linear responses.

Multiple Blocks Connected to the Output of a Preceding Block

Figure 38:
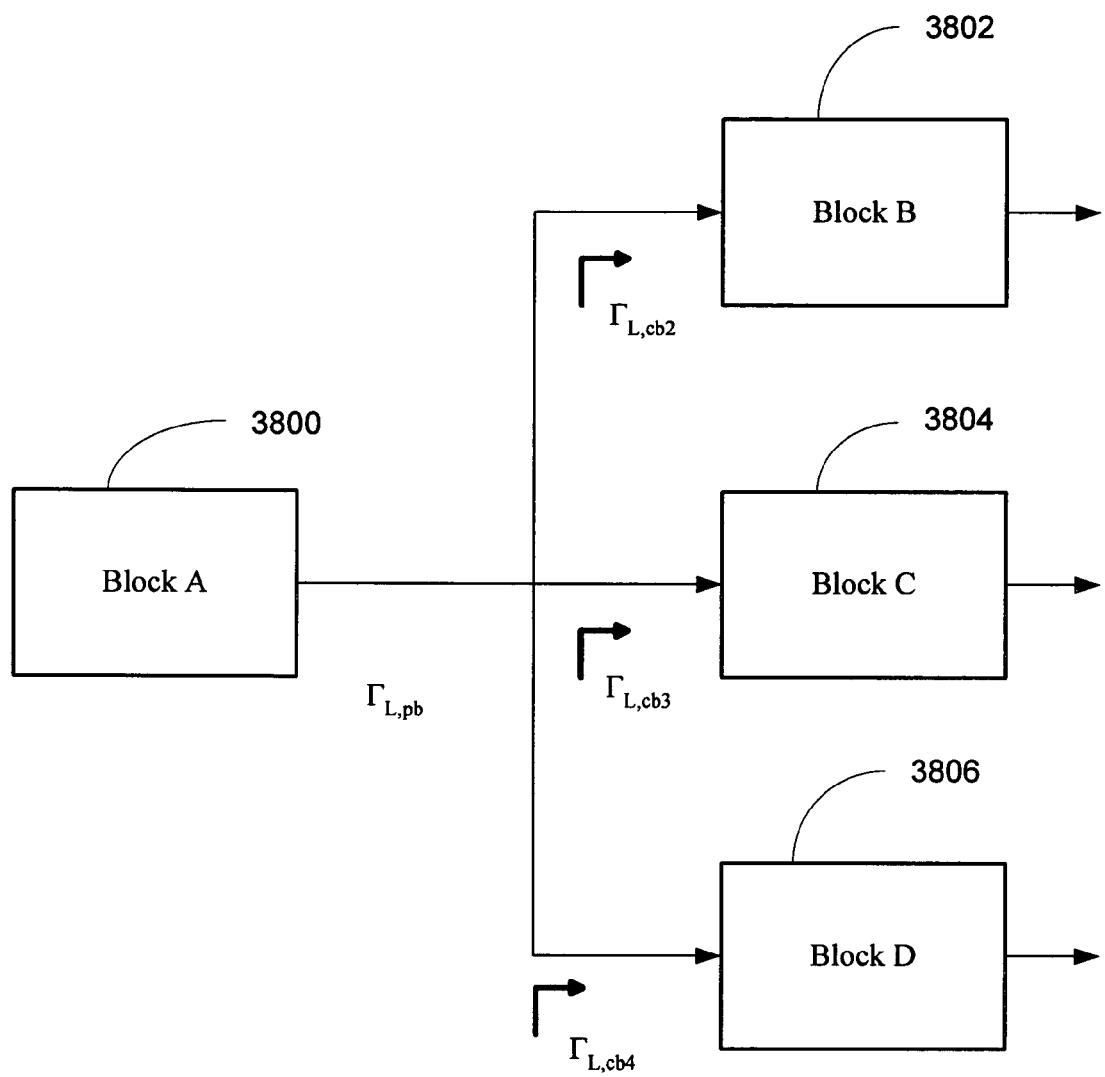
FIG. 38 is a block diagram illustrating an example where multiple blocks branch from the output node of a preceding block.

FIG. 38 illustrates where multiple blocks are connected to the output of a preceding block. The impedances seen looking out from the output node of Block A (3800) is found by combining the impedances seen looking into the input nodes of Block B (3802), Block C (3804) and Block D (3806) (i.e. Block B (3802), Block C (3804), and Block D (3806) are treated as impedances connected in parallel. If admittances are used, the admittances of these three blocks could simply be added together). During backward property propagation, the output node of Block A (3800) will receive three propagated impedances vectors, one each from Block B (3802), Block C (3804) and Block D (3806). The property propagation feature may provide a default "merging object" that handles the merging of more than one of the same property received at a node. This merging object can be customized to handle certain properties in special ways. In this example, the merging object was customized to handle combining the multiple impedances vectors in the proper way to create a single impedance vector received by the output node of Block A (3800).

Also, the original correction term equation should be modified in this situation. The original correction terms were calculated by:

$$\text{Block Correction} = \frac{b2}{a1} = \frac{S21}{1.0 - S22 \cdot \Gamma_L}$$

The Block Correction Equation is modified by Block B (3802), Block C (3804) and Block D (3806). The modified correction equation is:

$$\text{Block Correction} = \frac{1.0 + \Gamma_{L,pb}}{1.0 + \Gamma_{L,cbx}} \cdot \frac{S21}{1.0 - S22 \cdot \Gamma_L}$$

where $\Gamma_{L,pb}$ is the reflection coefficient looking out from the output node of the previous block (Block A in this example) and $\Gamma_{L,cbx}$ is the reflection coefficient looking into the input node of the current block (Blocks B, C, or D in this example). Note that if there is only one block connected to the output of a previous block, the $(1.0+\Gamma_{L,pb})/(1.0+\Gamma_{L,cbx})$ factor becomes 1.0 and reduces to the original block correction equation.

Figure 39:
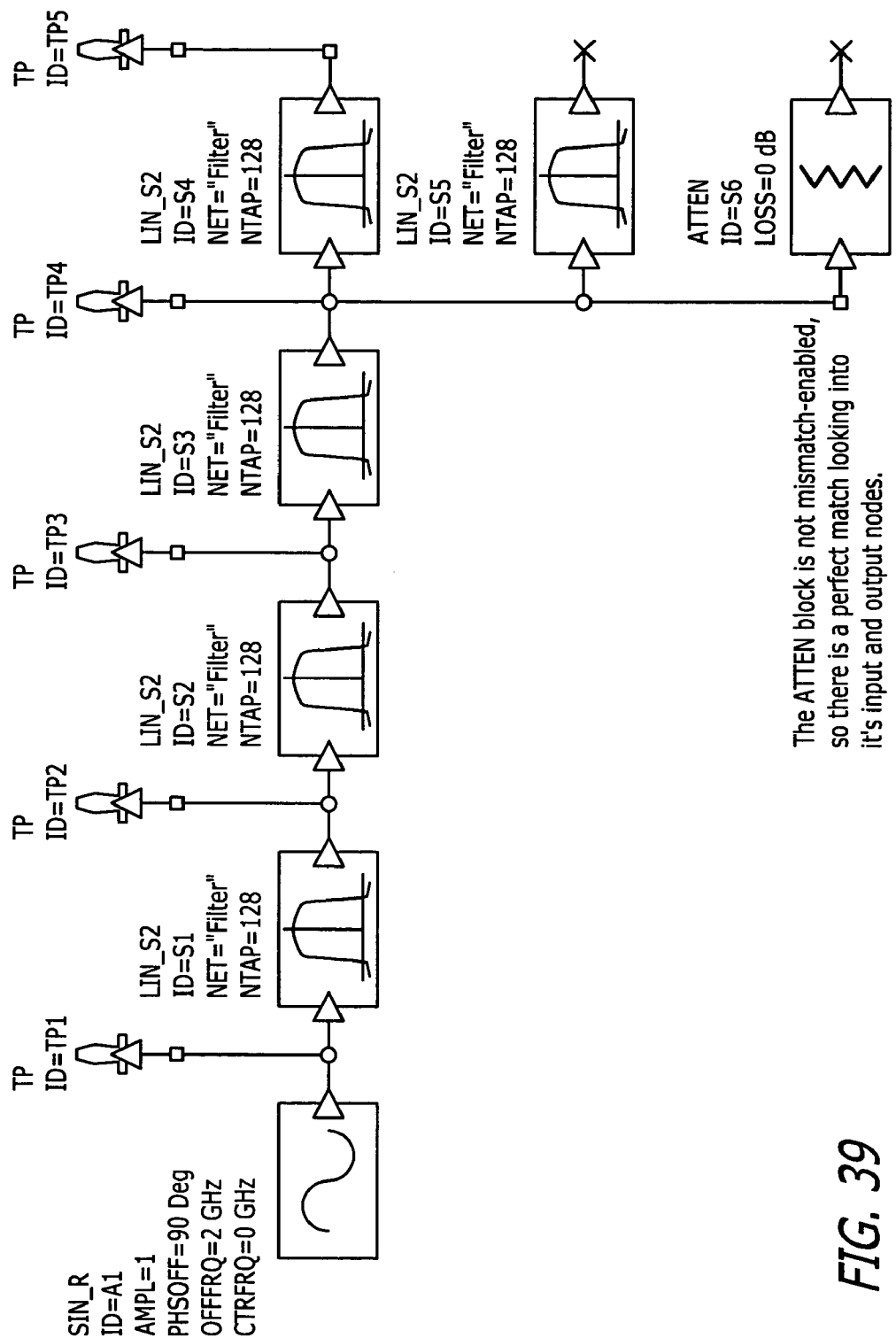
FIG. 39 is a block diagram illustrating a system comprising mismatch enabled blocks.
Figure 40:
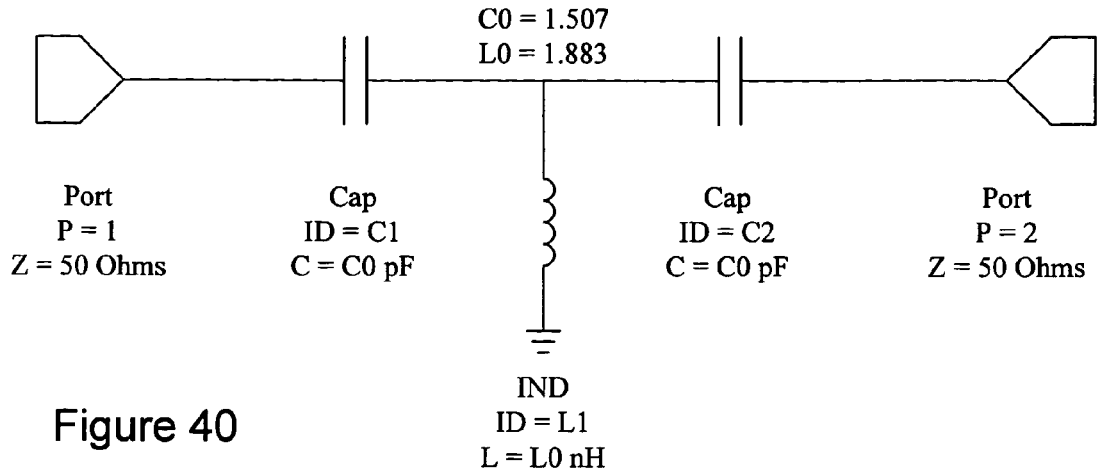
FIG. 40 is circuit diagram illustrating a filter schematic.
Figure 41:
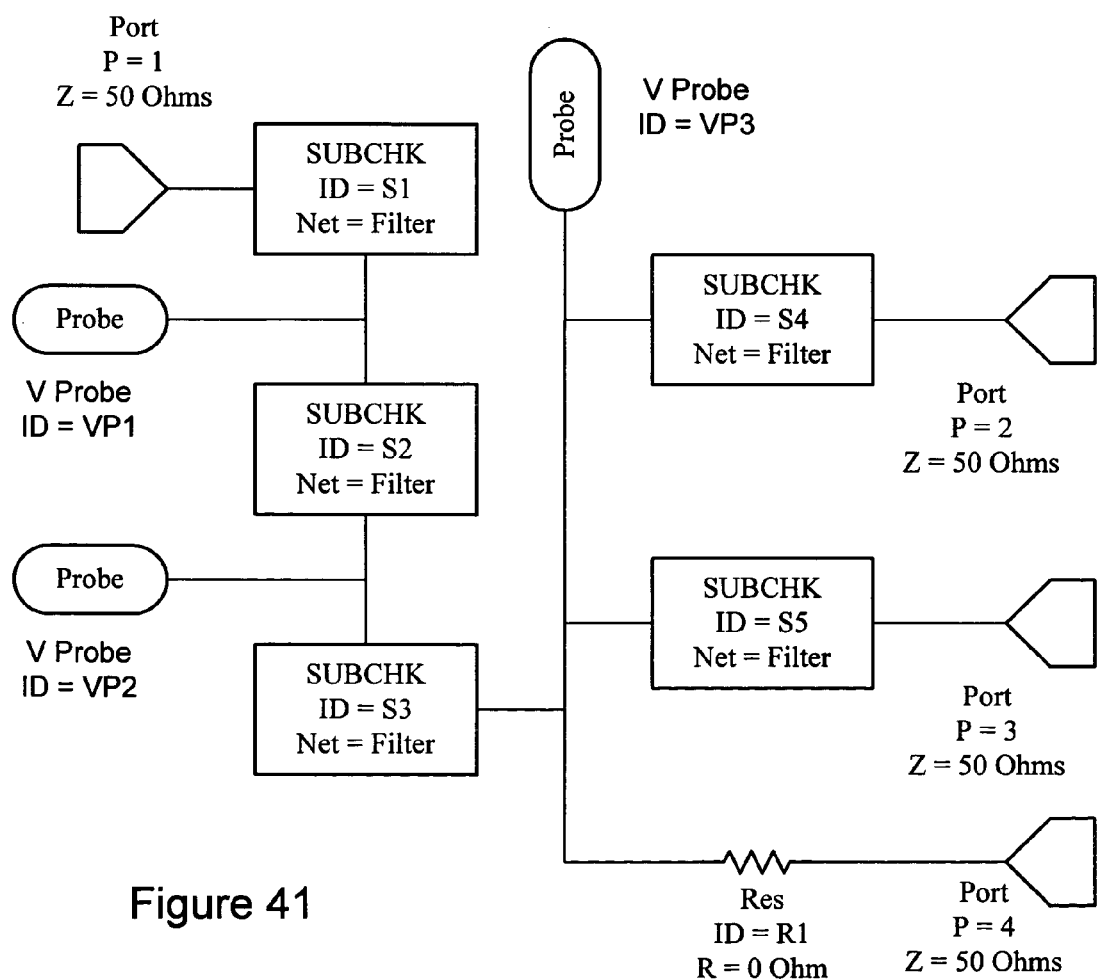
FIG. 41 is a block diagram illustrating a composite schematic that is the circuit equivalent of the system diagram of FIG. 39.

FIG. 39 is a block diagram illustrating a comparison of solutions with and without impedance mismatch correction. FIG. 39 illustrates a system diagram that contains several LIN_S2 blocks, that are mismatch-enabled (when the mismatch feature is turned off, the LIN_S2 block operates exactly like the LIN_S block). These LIN_S2 blocks reference a schematic that contains a lumped-element filter (see FIG. 40). For comparison, the equivalent of the system diagram is shown in FIG. 41. The input in both cases is a 2 GHz cosine, 1-volt peak waveform. The global mismatch frequency resolution is set to 0.2 GHz. The number of frequency points used for each block is set by the NTAP parameter, that is 128 for all blocks in this example.

Figure 42:
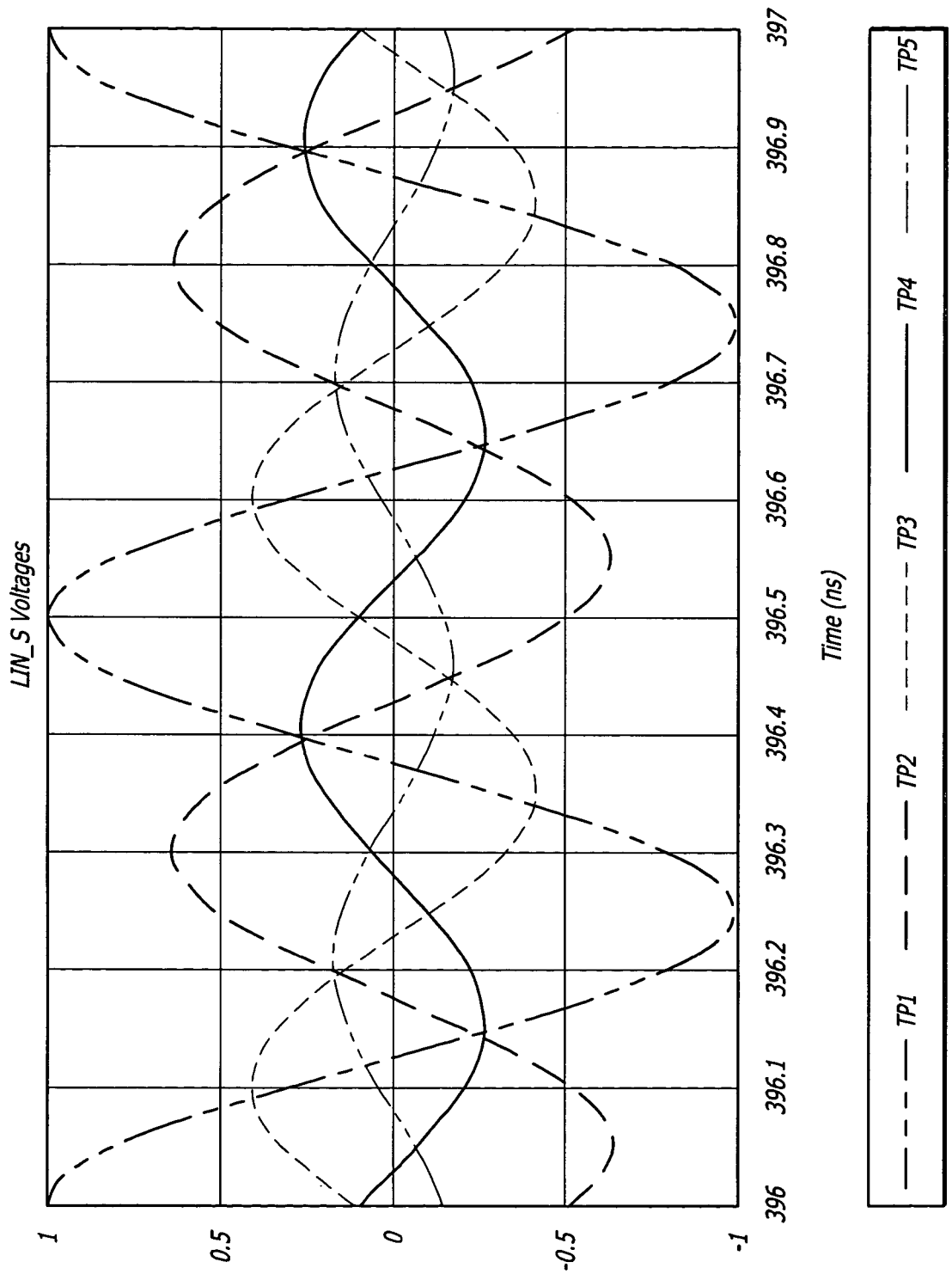
FIG. 42 is a graph illustrating diagram voltages where the system ignores the impedance mismatches.
Figure 43:
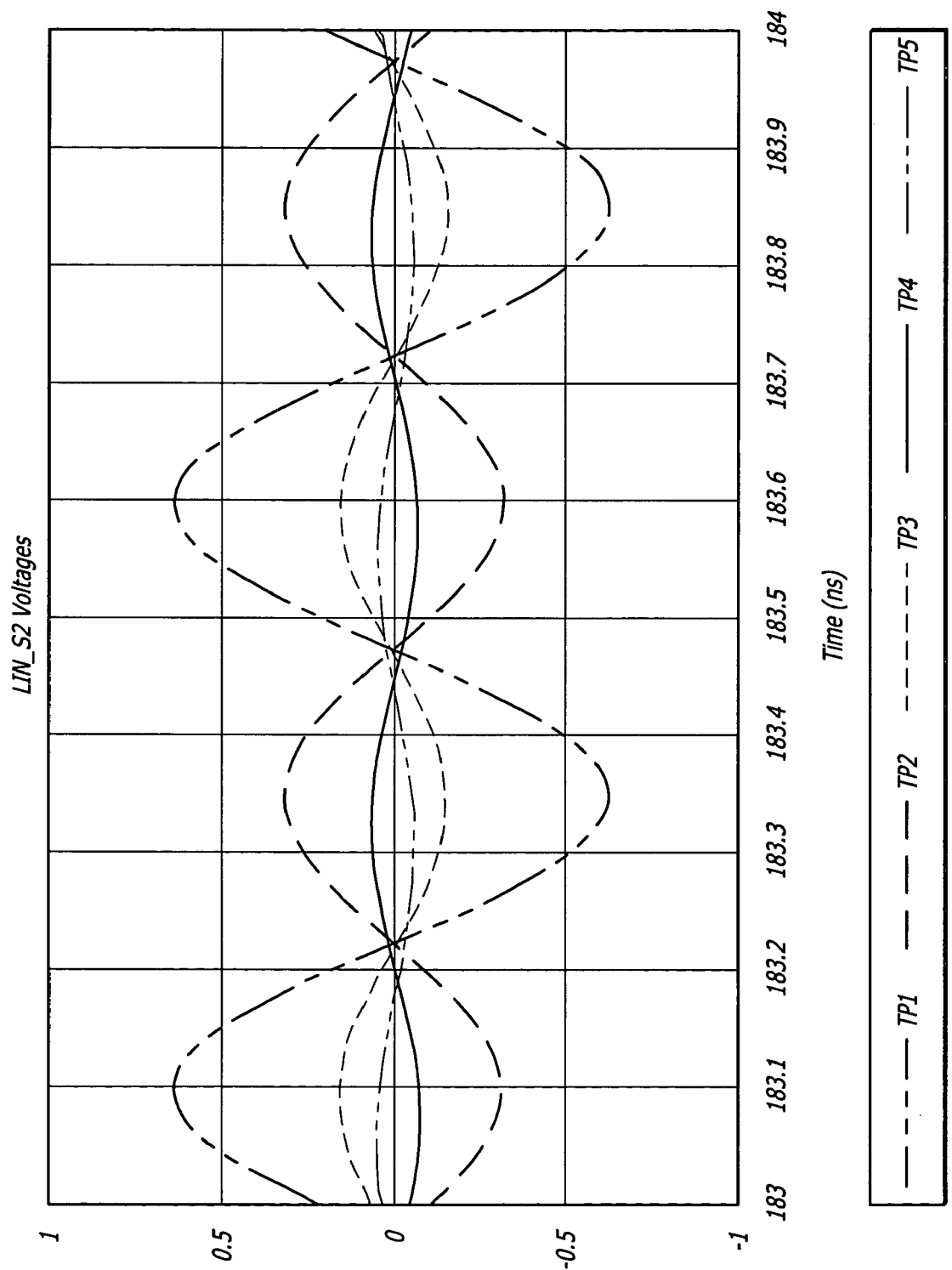
FIG. 43 is a graph illustrating diagram voltages where the system recognizes the impedance mismatches.
Figure 44:
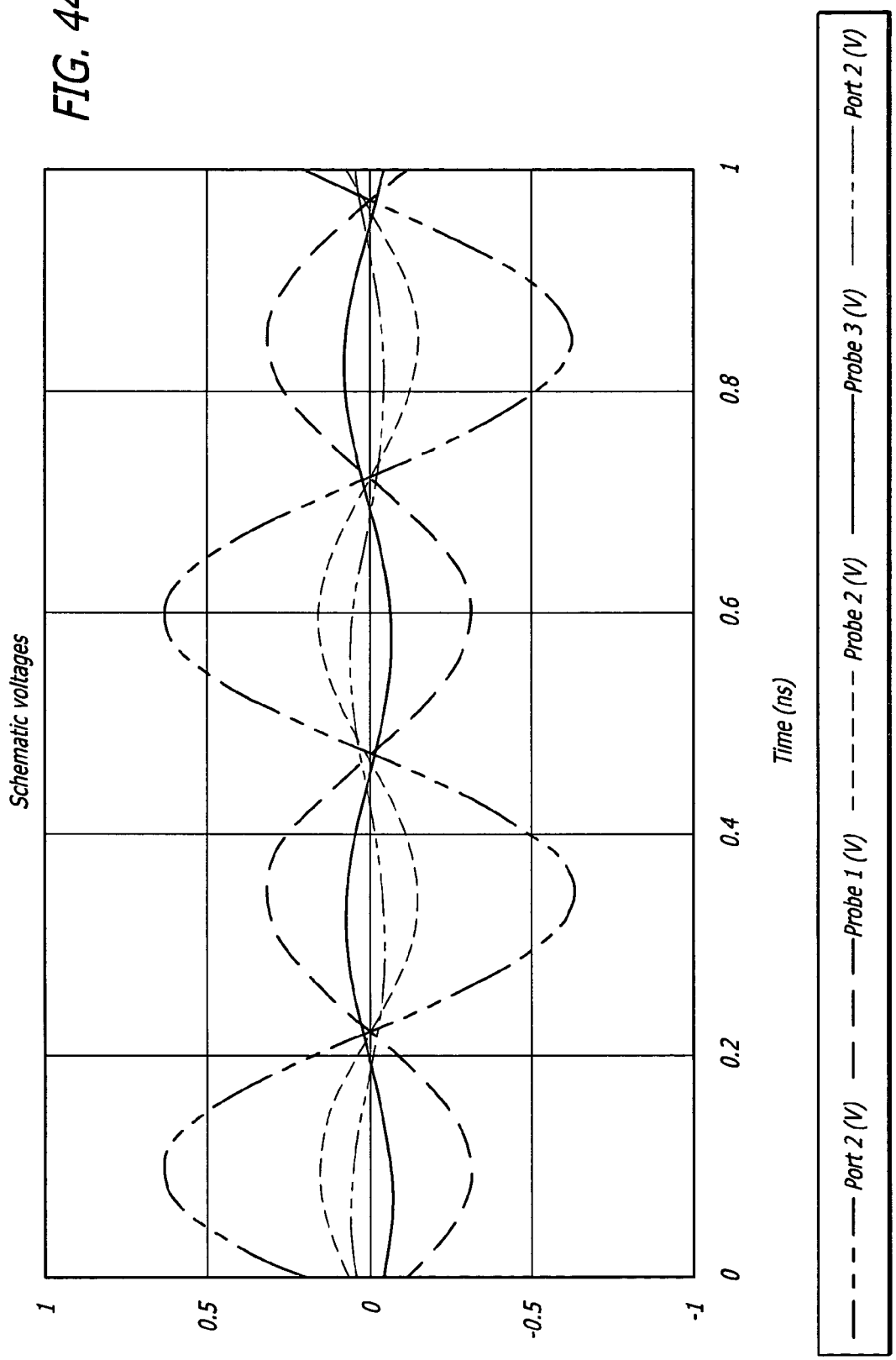
FIG. 44 is a graph illustrating diagram voltages obtained from a harmonic balance simulation.

FIG. 42 is a graph illustrating a plot of the voltage waveforms at various test points in the system diagram that ignores impedance mismatches. FIG. 43 is a graph illustrating a similar plot to FIG. 42, but with the impedance mismatch feature enabled. Finally, FIG. 44 is a graph illustrating the results of a harmonic balance simulation performed on the "composite" schematic. The waveforms in FIG. 43 match the waveforms of the harmonic balance simulation in FIG. 44. Note that the waveforms obtained with the impedance mismatch feature disabled are different from the waveforms obtained with the mismatch feature enabled.

The processes described in FIGS. 2-44 may be performed by hardware or software. If the process is performed by software, the software may reside in software memory (not shown) in a micro-controller, memory, a communication module, or a removable memory medium. The software in memory may include an ordered listing of executable instructions for implementing logical functions (i.e., "logic" that may be implement either in digital form such as digital circuitry or source code or in analog form such as analog circuitry or an analog source such an analog electrical, sound or video signal), may selectively be embodied in any computer-readable (or signal-bearing) medium for use by or in connection with an instruction execution system, apparatus, or device, such as a computer-based system, processor-containing system, or other system that may selectively fetch the instructions from the instruction execution system, apparatus, or device and execute the instructions. In the context of this document, a "computer-readable medium" and/or "signal-bearing medium" is any mechanism that may contain, store, communicate, propagate, or transport the program for use by or in connection with the instruction execution system, apparatus, or device. The computer readable medium may selectively be, for example but not limited to, an electronic, magnetic, optical, electromagnetic, infrared, or semiconductor system, apparatus, device, or propagation medium. More specific examples include a non-exhaustive list of the computer-readable medium would include any of the following: an electrical connection "electronic" having one or more wires, a portable computer diskette (magnetic), a RAM (electronic), a read-only memory "ROM" (electronic), an erasable programmable read-only memory (EPROM or Flash memory) (electronic), an optical storage system such as a read-only memory "CD-ROM" (optical), a DVD system such as DVD-ROM, DVD-RAM, and their derivative successor replacements. Note that the computer-readable medium may even be paper or another suitable medium upon which the program is printed, as the program can be electronically captured, via for instance optical scanning of the paper or other medium, then compiled, interpreted or otherwise processed in a suitable manner if necessary, and then stored in a computer memory.

While various embodiments of the invention have been described, it will be apparent to those of ordinary skill in the art that many more embodiments and implementations are possible that are within the scope of this invention.

What is claimed is:

1. A system simulator for calculating the impedance mismatch of a source block having at least one input and a plurality of outputs, comprising:

obtaining impedance values for output impedance of a first source block during reverse propagation, obtaining impedance value for input impedance of a second source block during forward propagation and impedance value for input impedance of a third source block during forward propagation by a property propagation methodology;

calculating in a microprocessor impedance value for input impedance of the first source block during forward propagation from the values for input impedance of the second source block, input impedance from the third source block during forward propagation and back propagating the value or input impedance to an input node for the first source block during forward propagation;

calculating in the microprocessor impedance values for output impedance of the first source block in reverse propagation from the values for input impedance from the first source block during forward propagation, input impedance from the third source block during forward propagation and back propagating the value of the output impedance of the first source block during reverse propagation to an output node for the first source block;

calculating in the microprocessor impedance values for output impedance of the third source block during reverse propagation from the values for input impedance from the first source block during forward propagation, input impedance from the second source block during forward propagation and back propagating the value of the output impedance of the third source block during reverse propagation to an output node for the first source block;

propagating the impedance values for output impedance of the second source block during reverse propagation and the new impedance value of output impedance of to the third source block during reverse propagation; and calculating in the microprocessor a value for impedance mismatch for the first source block, a value for impedance mismatch for the second source block and a value for impedance mismatch for the third source block.

2. The system simulator for calculating the impedance mismatch of a source block having at least one input and a plurality of outputs of claim 1, further comprising calculating a minimum and a maximum operating frequency values for the source block.

3. The system simulator for calculating the impedance mismatch of a source block having at least one input and a plurality of outputs of claim 2, further comprising storing the minimum and maximum operating frequency values of the source block in the system simulator.

4. The system simulator system for calculating the impedance mismatch of a source block having at least one input and a plurality of outputs of claim 3, further comprising determining on each propagation pass whether a new minimum or a new maximum operating frequency value obtained from the propagation pass is less the minimum operating frequency value or more than the maximum operating frequency value that is stored in the system simulator, and if so, updating the stored minimum operating frequency value with the new minimum operating frequency value and updating the stored maximum operating frequency value with the new maximum operating frequency value.

5. The system simulator system for calculating the impedance mismatch of a source block having at least one input and a plurality of outputs of claim 4, further comprising generating a global mismatch frequencies from a discrete set of frequencies having a range of resolution between the minimum operating frequency value and maximum operating frequency value.

6. The system simulator system for calculating the impedance mismatch of a source block having at least one input and a plurality of outputs of claim 5, where the global mismatch frequencies are complex, frequency dependent values.

7. The system simulator system for calculating the impedance mismatch of a source block having at least one input and a plurality of outputs of claim 5, further comprising calculating corrections values on the source block input signal.

8. A system simulator for calculating the impedance mismatch of a source block having a plurality of inputs and at least one outputs, comprising:

obtaining impedance values of output impedance of a first source block during reverse propagation, impedance value of output impedance from a second source block during reverse propagation and impedance value of input impedance from a third source block during forward propagation by a property propagation methodology;

calculating in a microprocessor impedance value of input impedance of the first source block during forward propagation from the values for input impedance from the second source block during forward propagation, input impedance from the third source block during forward propagation and back propagating the value of input impedance of the first source block during forward propagation to an input node for the first source block;

calculating in the microprocessor impedance values for input impedance of the first source block during forward propagation from the values for output impedance from the first source block during reverse propagation, input impedance from the third source block during forward propagation and back propagating the value of input impedance from the second source block during forward propagation to an output node for the first source block;

calculating in the microprocessor impedance values for output impedance of the first source block during reverse propagation from the values for output impedance from the first source block during reverse propagation, output impedance from the second source block during reverse propagation and back propagating the value of output impedance of the third source block during reverse propagation to an output node for the first source block;

propagating the impedance values for output impedance of the second source block during reverse propagation and the new impedance value output impedance of the third source block during reverse propagation; and calculating in the microprocessor values for a first impedance mismatch and a second impedance mismatch for the first source block, and a value for impedance mismatch for the third source block.

9. The system simulator for calculating the impedance mismatch of a source block having at least one input and a plurality of outputs of claim 8, further comprising calculating a minimum and a maximum operating frequency values for the source block.

10. The system simulator for calculating the impedance mismatch of a source block having at least one input and a plurality of outputs of claim 9, further comprising storing the minimum and maximum operating frequency values of the source block in the system simulator.

11. The system simulator system for calculating the impedance mismatch of a source block having at least one input and a plurality of outputs of claim 10, further comprising determining on each propagation pass whether a new minimum or a new maximum operating frequency value obtained from the propagation pass is less the minimum operating frequency value or more than the maximum operating frequency value that is stored in the system simulator, and if so, updating the stored minimum operating frequency value with the new minimum operating frequency value and updating the stored maximum operating frequency value with the new maximum operating frequency value.

12. The system simulator system for calculating the impedance mismatch of a source block having at least one input and a plurality of outputs of claim 11, further comprising generating a global mismatch frequencies from a discrete set of frequencies having a range of resolution between the minimum operating frequency value and maximum operating frequency value.

13. The system simulator system for calculating the impedance mismatch of a source block having at least one input and a plurality of outputs of claim 12, where the global mismatch frequencies are complex, frequency dependent values.

14. The system simulator system for calculating the impedance mismatch of a source block having at least one input and a plurality of outputs of claim 13, further comprising calculating corrections values on the source block input signal.

\* \* \* \* \*